(12) United States Patent
Li et al.

(10) Patent No.: US 12,419,114 B2
(45) Date of Patent: Sep. 16, 2025

(54) INTEGRATED CIRCUIT

(71) Applicant: TAIWAN SEMICONDUCTOR MANUFACTURING CO., LTD., Hsinchu (TW)

(72) Inventors: Jian-Sing Li, Hsinchu (TW); Guo-Huei Wu, Tainan (TW); Hui-Zhong Zhuang, Kaohsiung (TW); Chih-Liang Chen, Hsinchu (TW); Li-Chun Tien, Tainan (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 75 days.

(21) Appl. No.: 18/472,985

(22) Filed: Sep. 22, 2023

(65) Prior Publication Data

US 2024/0014203 A1    Jan. 11, 2024

Related U.S. Application Data

(63) Continuation of application No. 17/406,663, filed on Aug. 19, 2021, now Pat. No. 11,830,869, which is a
(Continued)

(51) Int. Cl.
*H01L 27/02* (2006.01)
*G06F 30/392* (2020.01)
(Continued)

(52) U.S. Cl.
CPC ........... *H10D 89/10* (2025.01); *G06F 30/392* (2020.01); *H01L 21/02603* (2013.01);
(Continued)

(58) Field of Classification Search
CPC .......... H01L 27/0207; H01L 21/02603; H01L 21/823807; H01L 21/823821;
(Continued)

(56) References Cited

U.S. PATENT DOCUMENTS 10,157,921 B2    12/2018   Chung
11,107,805 B2     8/2021   Li
(Continued)

FOREIGN PATENT DOCUMENTS

KR      20040016403 A     2/2004
KR      20170124940 A    11/2017
(Continued)

OTHER PUBLICATIONS

More Moore Team, "International roadmap for devices and systems 2017 edition", IEEE, 2018.
(Continued)

*Primary Examiner* — Tong-Ho Kim
(74) *Attorney, Agent, or Firm* — Maschoff Brennan

(57) ABSTRACT

An integrated circuit includes a first transistor of a first conductivity type including a first active area extending in a first direction; a second transistor of the first conductivity type including at least two second active areas extending in the first direction and a first gate stripe crossing the at least two second active areas; and a third transistor of a second conductivity type that is stacked on the second transistor and includes at least two third active areas arranged above the at least two second active areas. A top most boundary line of the first active area is aligned with a top most boundary line of one of the at least two third active areas in a layout view.

20 Claims, 16 Drawing Sheets

Related U.S. Application Data continuation of application No. 16/837,970, filed on Apr. 1, 2020, now Pat. No. 11,107,805.

(60) Provisional application No. 62/834,141, filed on Apr. 15, 2019.

(51) Int. Cl.
| | | |
|---|---|---|
| *H01L 21/02* | (2006.01) | |
| *H01L 21/8238* | (2006.01) | |
| *H01L 27/092* | (2006.01) | |
| *H01L 29/06* | (2006.01) | |
| *H01L 29/423* | (2006.01) | |
| *H01L 29/786* | (2006.01) | |
| *H10D 30/67* | (2025.01) | |
| *H10D 62/10* | (2025.01) | |
| *H10D 84/01* | (2025.01) | |
| *H10D 84/03* | (2025.01) | |
| *H10D 84/85* | (2025.01) | |
| *H10D 89/10* | (2025.01) | |

(52) U.S. Cl.
CPC ..... *H10D 30/6735* (2025.01); *H10D 30/6757* (2025.01); *H10D 62/121* (2025.01); *H10D 84/0167* (2025.01); *H10D 84/0186* (2025.01); *H10D 84/0193* (2025.01); *H10D 84/038* (2025.01); *H10D 84/856* (2025.01)

(58) Field of Classification Search
CPC ......... H01L 21/823871; H01L 27/0922; H01L 29/0673; H01L 29/42392; H01L 29/78696; H01L 27/11807; H01L 21/8221; H01L 27/0924; H01L 2027/11874; H01L 27/0688; H01L 27/092; H01L 27/088; H01L 21/8238; H01L 21/823828; H01L 29/66772; H01L 29/78654; G06F 30/392

USPC ........................................................ 257/351
See application file for complete search history.

(56) References Cited

U.S. PATENT DOCUMENTS

| | | | |
|---|---|---|---|
| 11,830,869 B2* | 11/2023 | Li | ..................... H01L 29/42392 |
| 2014/0245248 A1 | 8/2014 | Yang | |
| 2015/0061026 A1* | 3/2015 | Lin | ........................ H10D 89/10 |
| | | | 257/369 |
| 2017/0194349 A1 | 7/2017 | Chen et al. | |
| 2018/0158811 A1 | 6/2018 | Subhash et al. | |
| 2019/0006392 A1 | 1/2019 | Liu et al. | |
| 2020/0104446 A1 | 4/2020 | Li | |
| 2020/0235013 A1 | 7/2020 | Lilak | |
| 2020/0328210 A1* | 10/2020 | Wu | ..................... H01L 23/5384 |

FOREIGN PATENT DOCUMENTS

| | | |
|---|---|---|
| TW | I566365 B | 1/2017 |
| TW | 201834185 A | 9/2018 |
| TW | 201903859 A | 1/2019 |

OTHER PUBLICATIONS

J. Ryckaert et al., "The Complementary FET (CFET) for CMOS scaling beyond N3", 2018 IEEE Symposium on VLSI Technology, 2018.

Sorin Dobre et al., "Mixed Cell-Height Implementation for Improved Design Quality in Advanced Nodes", 2015 IEEE/ACM International Conference on Computer-Aided Design (ICCAD), 2015.

Jianli Chen et al., "Mixed-Cell-Height Placement with Complex Minimum-Implant-Area Constraints", 2018 IEEE/ACM International Conference on Computer-Aided Design (ICCAD), 2018.

* cited by examiner

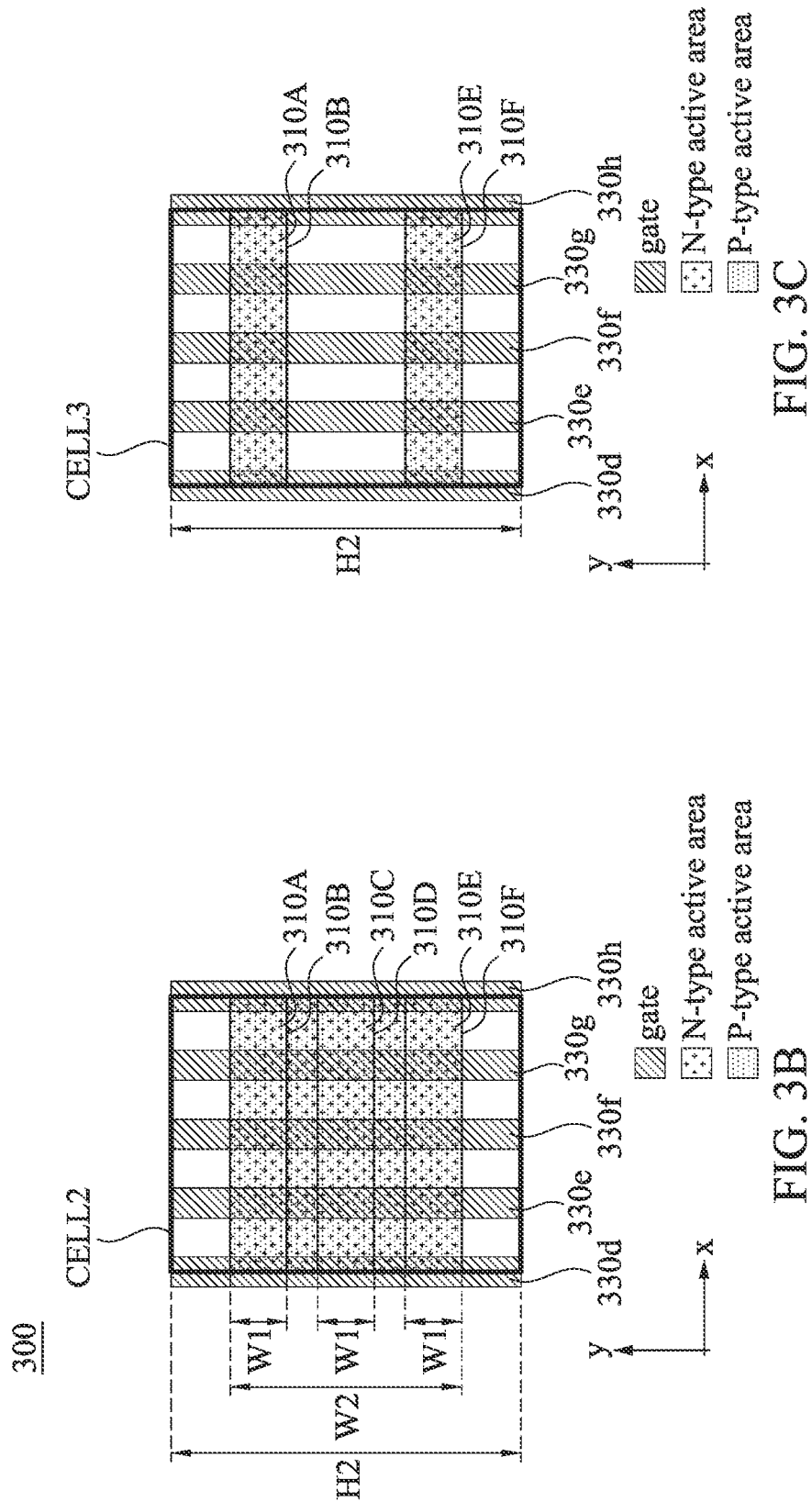

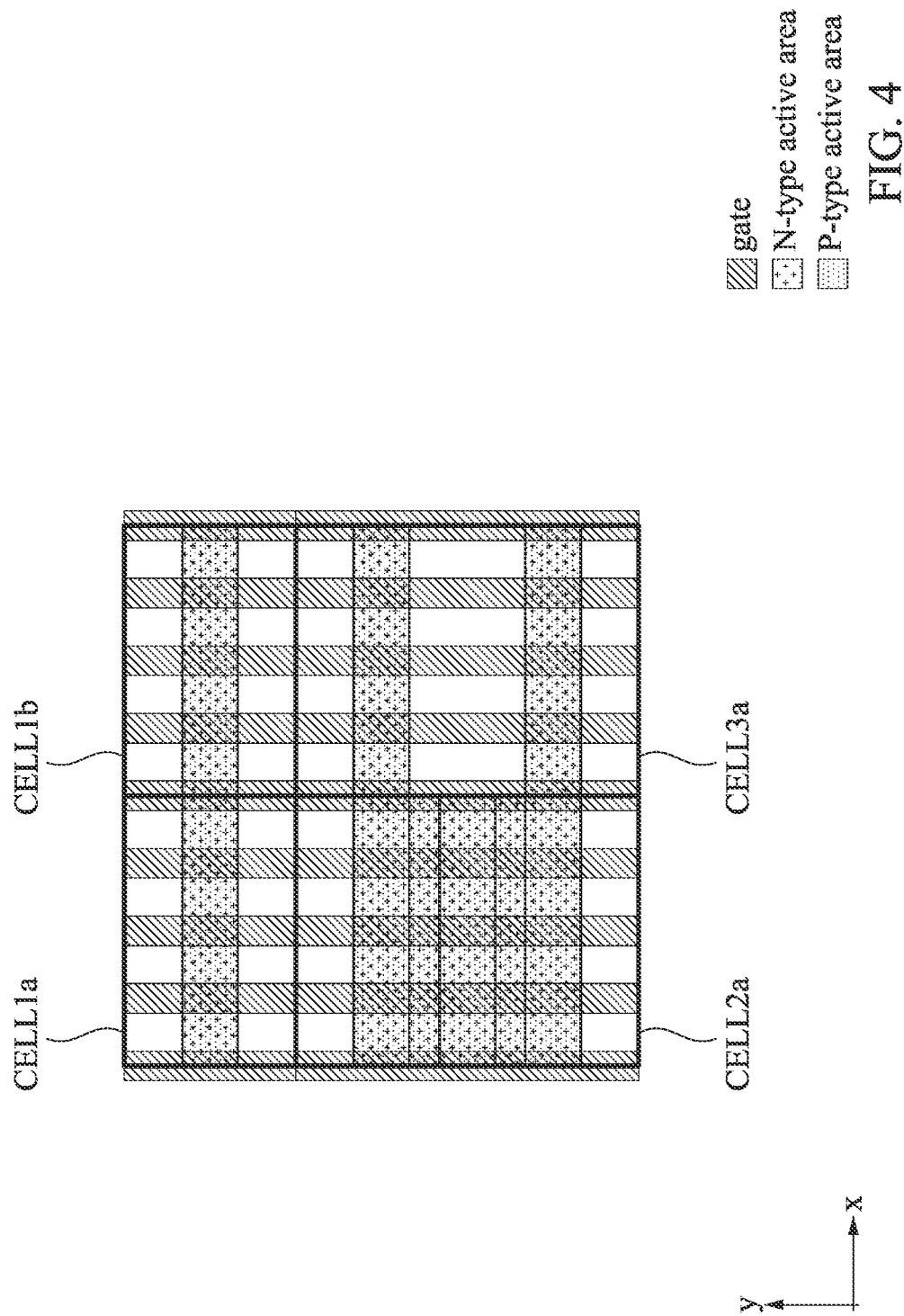

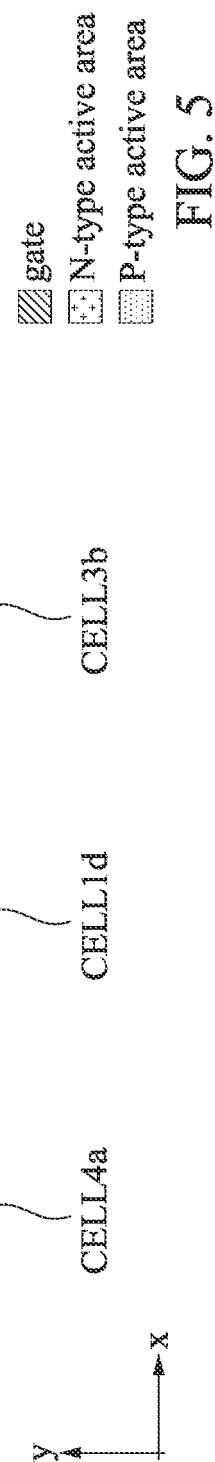

INTEGRATED CIRCUIT

PRIORITY CLAIM AND CROSS-REFERENCE

This application is a continuation of U.S. application Ser. No. 17/406,663, filed Aug. 19, 2021, which is a continuation of U.S. application Ser. No. 16/837,970, filed Apr. 1, 2020, now U.S. Pat. No. 11,107,805, issued Aug. 31, 2021, which claims priority of U.S. Provisional Application Ser. No. 62/834,141, filed Apr. 15, 2019, which is herein incorporated by reference.

BACKGROUND

Along with the progressive process of manufacturing semiconductor devices, layout design with cells of different cell heights has been widely implemented in the industry. Furthermore, greater cell density with mixed cell height in the layout and better computing performance of cells within limited area is demanded.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 3B is a layout diagram in a plan view of part of the integrated circuit corresponding to a part of FIG. 3A, in accordance with various embodiments. FIG. 3C is a layout diagram in a plan view of part of the integrated circuit corresponding to a part of FIG. 3A, in accordance with various embodiments.

FIG. 4 is a layout diagram in a plan view of part of an integrated circuit, in accordance with various embodiments.

FIG. 5 is a layout diagram in a plan view of part of an integrated circuit, in accordance with various embodiments.

DETAILED DESCRIPTION

Figure 1:
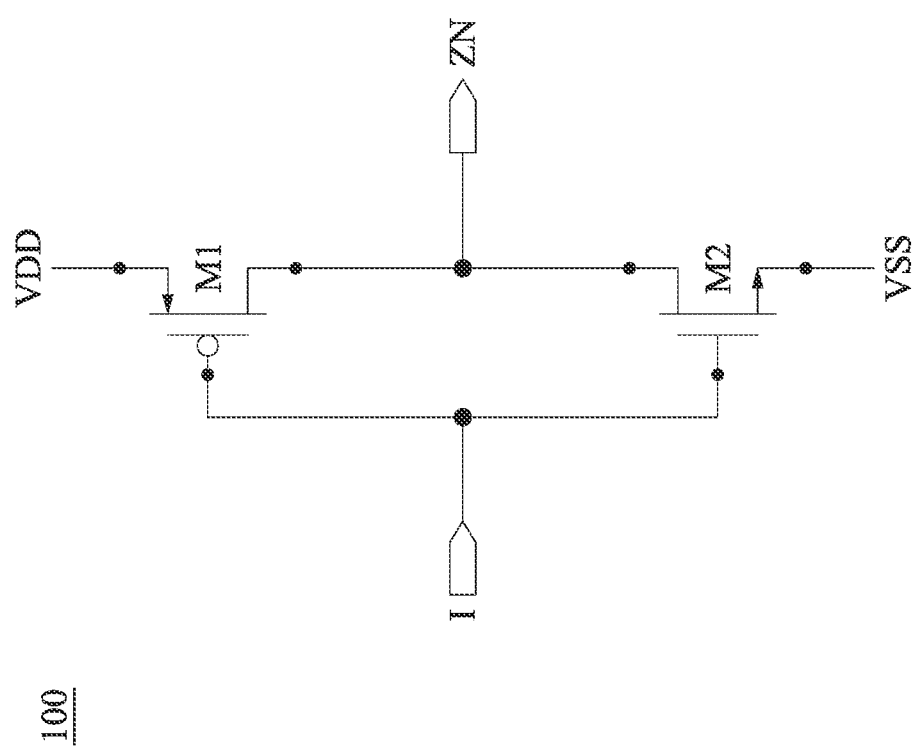
FIG. 1 is an equivalent circuit of part of an integrated circuit, in accordance with various embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

The terms used in this specification generally have their ordinary meanings in the art and in the specific context where each term is used. The use of examples in this specification, including examples of any terms discussed herein, is illustrative only, and in no way limits the scope and meaning of the disclosure or of any exemplified term. Likewise, the present disclosure is not limited to various embodiments given in this specification.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. As used herein, the term "and/or" includes any and all combinations of one or more of the associated listed items.

As used herein, "around", "about", "approximately" or "substantially" shall generally refer to any approximate value of a given value or range, in which it is varied depending on various arts in which it pertains, and the scope of which should be accorded with the broadest interpretation understood by the person skilled in the art to which it pertains, so as to encompass all such modifications and similar structures. In some embodiments, it shall generally mean within 20 percent, preferably within 10 percent, and more preferably within 5 percent of a given value or range. Numerical quantities given herein are approximate, meaning that the term "around", "about", "approximately" or "substantially" can be inferred if not expressly stated, or meaning other approximate values.

Reference is now made to FIG. 1. FIG. 1 is an equivalent circuit of part of an integrated circuit 100, in accordance with various embodiments. For illustration, the integrated circuit 100 includes transistors M1 and M2. A Source of the transistor M1 is coupled to a power supply terminal VDD, and a drain of the transistor M1 is coupled to an output node ZN. A source of the transistor M2 is coupled to a power supply terminal VSS, and a drain of the transistor M2 is coupled to the output node ZN. A gate of the transistor M1 and a gate of the transistor M2 are coupled together at an input node I of the integrated circuit 100. In some embodiments, the integrated circuit 100 operates as an inverter. The equivalent circuit of the integrated circuit 100 is given for illustrative purposes. Various configurations of the integrated circuit 100 are within the contemplated scope of the present disclosure. For example, in some embodiments, the integrated circuit 100 is a logic gate circuit including AND, OR, NAND, MUX, Flip-flop, Latch, BUFF or any other types of logic circuit.

In some embodiments, the transistor M1 is a first conductivity type FET (e.g., P-type), and the transistor M2 is a second conductivity type FET (e.g., N-type) different from the first conductivity type. The transistors M1-M2 are given for illustrative purposes. Various configurations of the transistors M1-M2 are within the contemplated scope of the present disclosure. For example, in some embodiments, the transistor M1 is an N-type transistor, and the transistor M2 is a P-type transistor.

Figure 2A:
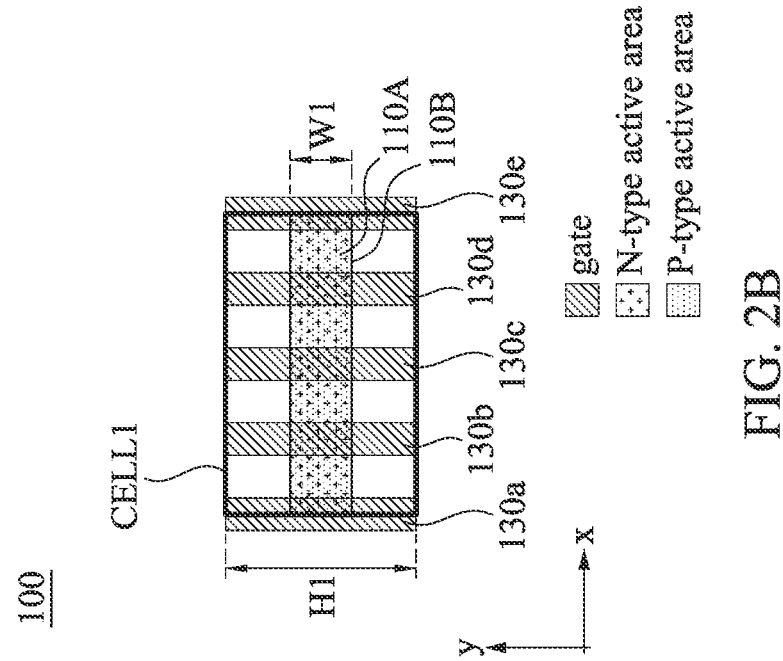
FIG. 2A is a perspective diagram of part of the integrated circuit of FIG. 1, in accordance with various embodiments.

Reference is now made to FIG. 2A. FIG. 2A is a perspective diagram of part of the integrated circuit 100 of FIG. 1, in accordance with various embodiments. For illustration, the integrated circuit 100 includes active regions 111-114, conductive segments 121-124, gate 130, power rails 141-142, metal-zero segments 151-153, and vias 161-163. In some embodiments, the power rails 141-142 are disposed in a first layer. The active regions 111-112 and the conductive segments 121-122 are disposed in a second layer above the first layer. The active regions 113-114 and the conductive segments 123-124 are disposed in a third layer above the second layer. The gate 130 extends through the first layer, the second layer, and the third layer. The metal-zero segments 151-153 are disposed in a fourth layer above the third layer.

With reference to FIGS. 1 and 2A, in some embodiments, the active regions 111-112, the gate 130 and the conductive segments 121-122 are configured with respect to, for example, the transistor M2 of FIG. 1. The active regions 113-114, the gate 130 and the conductive segments 123-124 are configured with respect to, for example, the transistor M1 of FIG. 1. Specifically, the conductive segment 121 corresponds to the drain of the transistor M2 that is coupled to the output node ZN. The conductive segment 122 corresponds to the source of the transistor M2 that is coupled to the power supply terminal VSS. The conductive segment 123 corresponds to the source of the transistor M1 that is coupled to the power supply terminal VDD. The conductive segment 124 corresponds to the drain of the transistor M1 that is coupled to the output node ZN. The gate 130 is configured as the gates of the transistors M1 and M2 that are coupled to each other.

With continued reference to FIG. 2A, for illustration, the active regions 111-114 extend in x direction. The active regions 111-112 are separate from the active regions 113-114 in z direction. In some embodiments, the active regions 111-112 are configured to have the second conductivity type (N-type), and the active regions 113-114 are configured to have the first conductivity type (P-type) different from the second conductivity type. Illustratively, the active regions 111-112 are configured as an active area 110A, and the active regions 113-114 are configured as an active area 110B. The configurations of FIG. 2A are given for illustrative purposes.

Various configurations of the active regions 111-114 are within the contemplated scope of the present disclosure. For example, in various embodiments, the active regions 111-112 have the P-type conductivity type and the active regions 113-114 have the N-type conductivity type. In alternative embodiments, the active regions 111-114 have the same conductivity type.

For illustration, the conductive segments 121-124 extend in y direction that is different from x and z direction. As shown in FIG. 2A, the conductive segments 121 and 122 are coupled to the active regions 111 and 112 respectively, and the conductive segments 123 and 124 are coupled to the active regions 113 and 114 respectively. In some embodiments, the conductive segments 121-124 are penetrated by the corresponding active regions coupled thereto. In some embodiments, in a plan view, the conductive segment 121 overlaps the conductive segment 123, and the conductive segment 122 overlaps the conductive segment 124.

For illustration, as shown in FIG. 2A, the gate 130 extends along y direction and z direction and is disposed between the conductive segments 121, 123 and conductive segment 122, 124. In some embodiments, the gate 130 crosses the active regions 111-114 along y direction.

In some embodiments, the gate 130 includes a gate dielectric layer (not shown) and a gate electrode layer (not shown). In some embodiments, the gate 130 is formed around channel regions of the transistors M1 and M2, in which the channel regions include, for example, structures of round/square wire, nanoslab, nano-sheet, multi-bridge channel, nano-ring or any other suitable kinds of the nano structures.

The power rails 141-142 extend in x direction and are separate from each other along y direction. In some embodiments, the power rail 141 receives the voltage VDD for the integrated circuit 100, and the power rail 142 receives the voltage VSS for the integrated circuit 100.

The metal-zero segments 151-153 extend in x direction and are separate from each other along y direction. In some embodiments, the metal-zero segment 151 is coupled to the input node I of FIG. 1 to transmit a control signal to the gate 130 for controlling the transistors M1 and M2. The metal-zero segment 152 is coupled to the output node ZN of FIG. 1 for outputting an output signal from the integrated circuit.

The vias 161-165 extend in z direction. The via 161 is coupled between the conductive segment 123 and the power rail 141. The via 162 is coupled between the conductive segment 122 and the power rail 142. The via 163 is coupled between the conductive segment 122 and the conductive segment 124. The via 164 is coupled between the gate 130 and the metal-zero segment 151. The via 165 is coupled between the conductive segment 124 and the metal-zero segment 152.

Figure 2B:
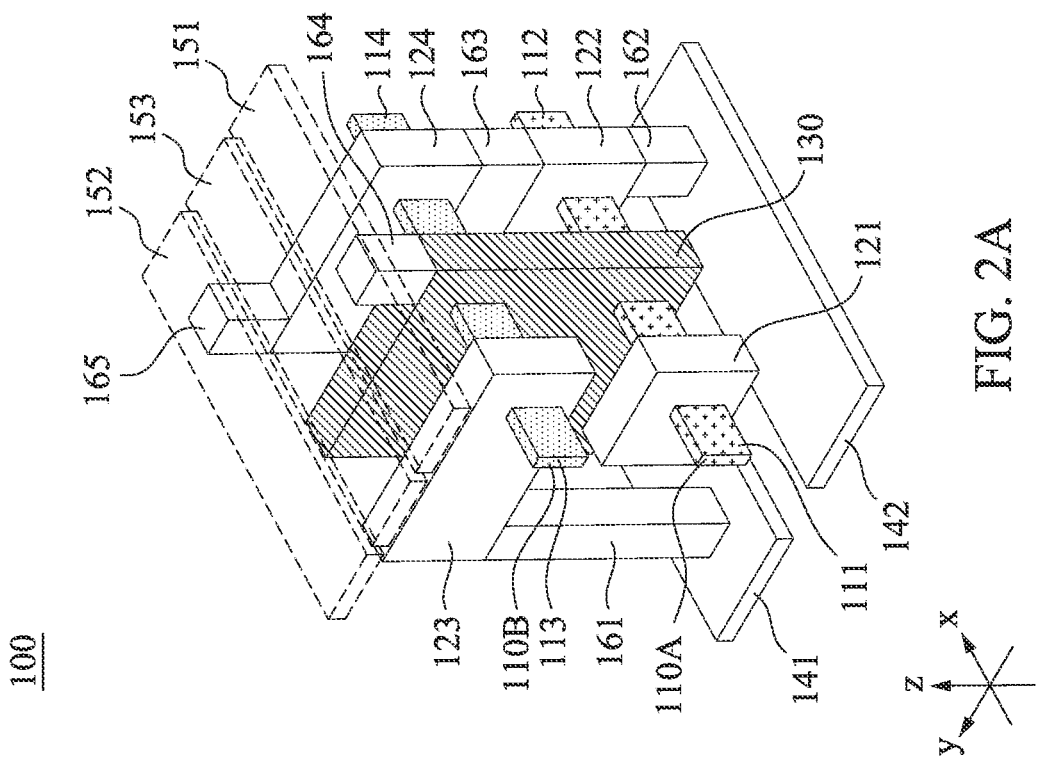
FIG. 2B is a layout diagram in a plan view of part of the integrated circuit corresponding to a part of FIG. 2A, in accordance with various embodiments.

Reference is now made to FIG. 2B. FIG. 2B is a layout diagram in a plan view of part of the integrated circuit 100 corresponding to a part of FIG. 2A, in accordance with various embodiments. For illustration, the integrated circuit 100 further includes gate stripes 130a-130e. In some embodiments, at least one in the gate stripes 130a-130e is configured with respect to, for example, the gate 130, and the rest of the gate stripes 130a-130e are referred to as dummy gates, in which in some embodiments, the "dummy" gates are referred to as being not electrically connected as the gates for MOS devices, having no function in the circuit. In some embodiments, the gate stripes 130a-130e extend in y direction. For simplicity of illustration, the conductive segments 121-124, the power rails 141-142, the metal-zero segments 151-153, and the vias 161-165 are not shown in FIG. 2B.

For illustration, the active areas 110A-110B of FIG. 2A are configured to have a width W1. As shown in FIG. 2B, the active areas 110A and 110B extend in x direction and overlap with each other in the plain view. The configurations of the active areas 110A-110B are given for illustrative purposes. Various implements of the active areas 110A-110B are within the contemplated scope of the present disclosure. For example, in some embodiments, the active area 110A and the active area 110B have different width from each other.

With continued reference to FIG. 2B, for illustration, the gate stripes 130a-130e cross the active areas 110A-110B. In some embodiments, the gate stripes 130a-130e and the active areas 110A-110B are included in a cell CELL1 in a layout view. Moreover, in some embodiments, the cell CELL1 has a cell height H1 along y direction. The configurations of the cell CELL1 are given for illustrative purposes. Various implements of the cell CELL1 are within the contemplated scope of the present disclosure. For example, in some embodiments, instead of multiple gate structures being included in the cell CELL1, only one gate structure is included in the cell CELL1.

Figure 3A:
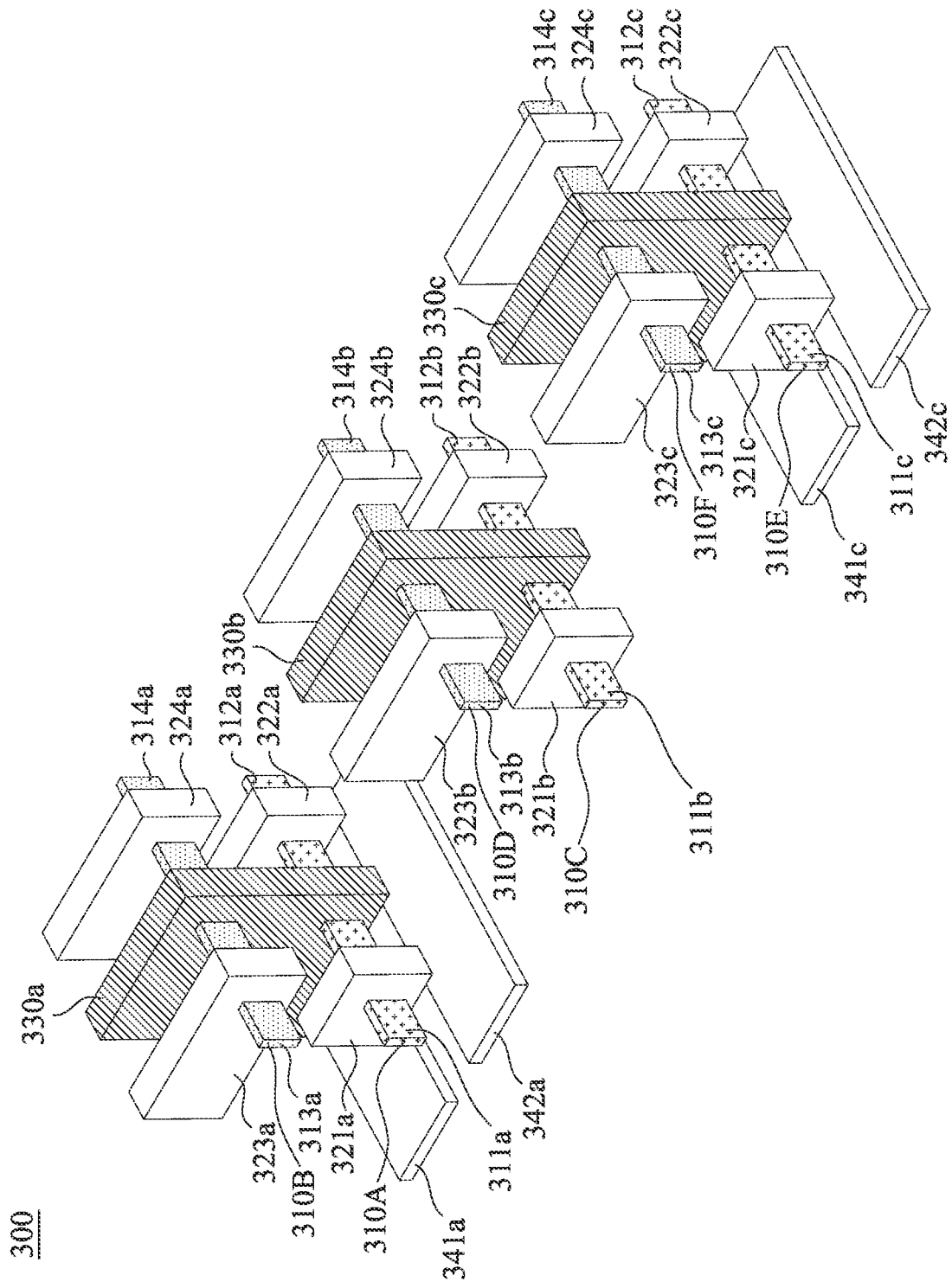
FIG. 3A is a perspective diagram of part of an integrated circuit, in accordance with various embodiments.

Reference is now made to FIG. 3A. FIG. 3A is a perspective diagram of part of an integrated circuit 300, in accordance with various embodiments. For illustration, the integrated circuit 300 includes active regions 311a-311c, 312a-312c, 313a-313c, and 314a-314c, conductive segments 321a-321c, 322a-322c, 323a-323c, and 324a-324c, gates 330a-330c, and power rails 341a-341b and 342a-342b. For simplicity of illustration, the metal-zero segments 151-153 and the vias 161-165 are not shown in FIG. 3A.

In some embodiments, the active regions 311a-311c, 312a-312c, 313a-313c, and 314a-314c are configured with respect to, for example, the active regions 111, 112, 113 and 114 of FIG. 2A separately. For illustration, the active regions 311a-311c, 312a-312c, 313a-313c, and 314a-314c are separate from each other in y direction. Illustratively, the active regions 311a-312a are configured to be as an active area 310A. The active regions 313a-314a are configured to be as an active area 310B. The active regions 311b-312b are configured to be as an active area 310C. The active regions 313b-314b are configured to be as an active area 310D. The active regions 311c-312c are configured to be as an active area 310E. The active regions 313c-314c are configured to be as an active area 310F. In some embodiments, the active areas 310A, 310C, 310E are configured with respect to, for example, the active area 110A of FIG. 2B, and the active areas 310B, 310D, 310F are configured with respect to, for example, the active area 110B of FIG. 2B.

The conductive segments 321a-321c, 322a-322c, 323a-323c, and 324a-324c are configured with respect to, for example, the conductive segments 121, 122, 123 and 124 of FIG. 2A separately. In some embodiments, as shown in FIG. 3A, the conductive segments 321a-321c, 322a-322c, 323a-323c, and 324a-324c are separate from each other in y direction.

The gates 330a-330c are configured with respect to, for example, the gate 130 of FIG. 2A. In some embodiments, as shown in FIG. 3A, the gates 330a-330c are separate from each other in y direction.

For illustration, as shown in FIG. 3A, the power rails 341a-341b and 342a-342b are separate from each other in y direction.

With the configurations of FIG. 3A, in some embodiments, the integrated circuit 300 provides high performance computing ability by implementing multiple active regions operating together corresponding to a source/drain of a transistor. Alternatively stated, one skilled in the art is available to achieve the desired computing ability by implementing the configurations of FIG. 3A.

The configurations of FIG. 3A are given for illustrative purposes. Various implements of the integrated circuit 300 are within the contemplated scope of the present disclosure. For example, in some embodiments, the integrated circuit 300 includes more than three or less than three active regions configured with respect to the active regions 111, 112, 113 and/or 114. In various embodiments, the integrated circuit 300 includes only one pair of power rails instead of having the power rails 341b and 342b. Moreover, in some embodiments, the gates 330a-330c are formed into one gate structure, and/or the conductive segments 321a-321c, 322a-322c, 323a-323c, and/or 324a-324c are formed into one conductive segment structure.

Reference is now made to FIG. 3B. FIG. 3B is a layout diagram in a plan view of part of the integrated circuit 300 corresponding to a part of FIG. 3A, in accordance with various embodiments. For illustration, the integrated circuit 300 further includes gate stripes 330d-130h. The gate stripes 330d-130h are configured with respect to, for example, the gate 330a-330c. In some embodiments, the gate stripes 330d-330h extend in y direction. For simplicity of illustration, the conductive segments 321a-321c, 322a-322c, 323a-323c, and 324a-324c, and the power rails 341a-341b and 342a-342b are not shown in FIG. 2B.

For illustration, as shown in FIG. 3B, the active areas 310A-310F, each having a width of W1, extend in x direction. In a layout view, the active areas 310A-310B overlap with each other, the active areas 310C-310D overlap with each other, and the active areas 310E-310F overlap with each other.

In some embodiments, as shown in FIG. 3B, the active areas 310A, 310C, and 310E are close to each other and further operate together with corresponding elements as the transistor M2 of FIG. 1. Similarly, the active areas 310B, 310D, and 310F are close to each other and further operate together with corresponding elements as the transistor M1 of FIG. 1.

As discussed above, in some embodiments, the active areas 310A-310F are arranged in a portion having a width W2 in the integrated circuit 300 as illustrated in FIG. 3B.

With continued reference to FIG. 3B, for illustration, the gate stripes 330d-330h cross the active areas 310-310F. In some embodiments, the gate stripes 330d-330h and the active areas 310-310F are included in a cell CELL2 in a layout view. Moreover, in some embodiments, the cell CELL2 has a cell height H2 along y direction. In some embodiments, the cell height H2 is double of the cell height H1. The configurations of the cell CELL2 are given for illustrative purposes. Various implements of the cell CELL2 are within the contemplated scope of the present disclosure. For example, in some embodiments, instead of multiple gate structures being included in the cell CELL2, only one gate structure is included in the cell CELL2.

Reference is now made to FIG. 3C. FIG. 3C is a layout diagram in a plan view of part of the integrated circuit 300 corresponding to a part of FIG. 3A, in accordance with various embodiments. With respect to the embodiments of FIG. 3C, like elements in FIG. 3B are designated with the same reference numbers for ease of understanding. The specific operations of similar elements, which are already discussed in detail in above paragraphs, are omitted herein for the sake of brevity, unless there is a need to introduce the co-operation relationship with the elements shown in FIG. 3C.

Compared with the embodiments of the cell CELL2 in FIG. 3B, instead of including the active areas 310A-310F, a cell CELL3 is formed to include the active areas 310A, 310B, 310E and 310F. In some embodiments, the cell CELL3 has the cell height H2 along y direction.

Figure 3D:
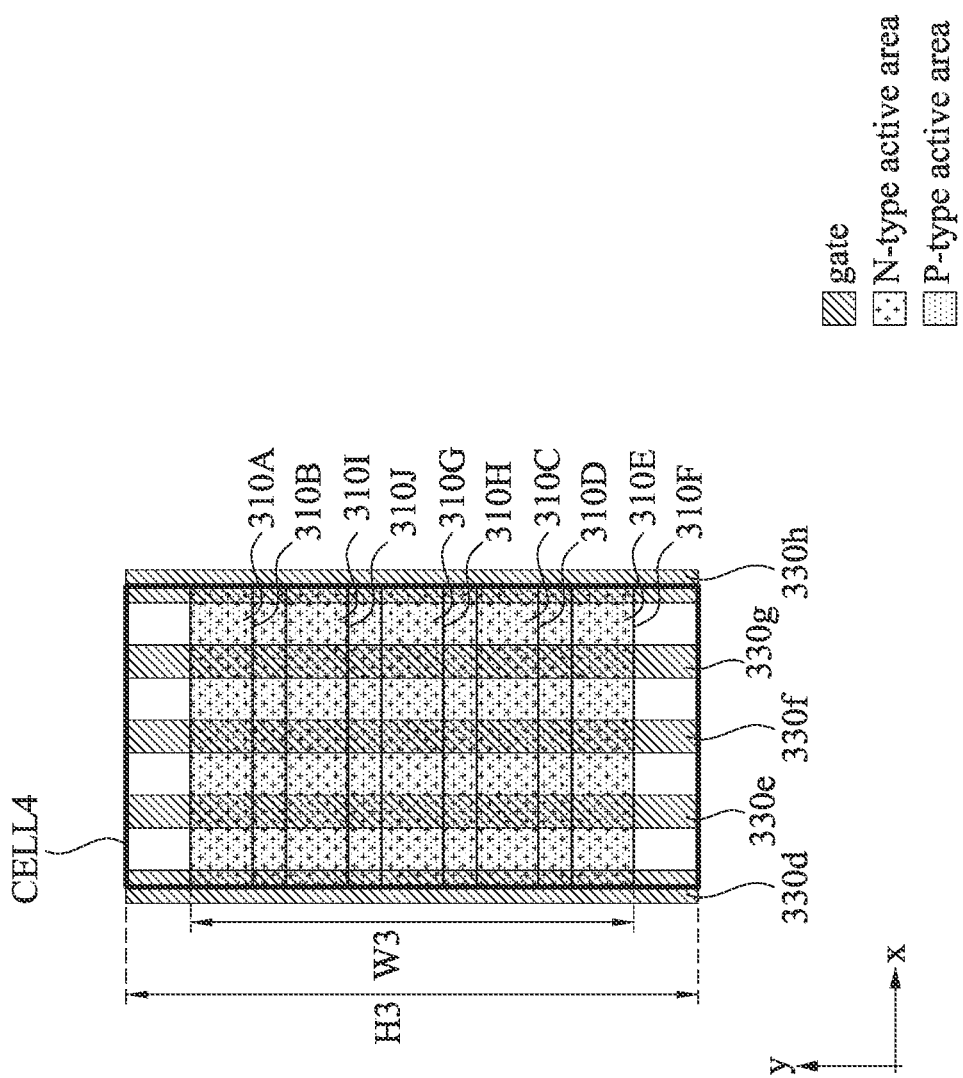
FIG. 3D is a layout diagram in a plan view of part of the integrated circuit corresponding to a part of FIG. 3A, in accordance with various embodiments.

Reference is now made to FIG. 3D. FIG. 3D is a layout diagram in a plan view of part of the integrated circuit 300 corresponding to a part of FIG. 3A, in accordance with various embodiments. With respect to the embodiments of FIG. 3D, like elements in FIG. 3B are designated with the same reference numbers for ease of understanding. The specific operations of similar elements, which are already discussed in detail in above paragraphs, are omitted herein for the sake of brevity, unless there is a need to introduce the co-operation relationship with the elements shown in FIG. 3D.

Compared with the embodiments of the cell CELL2 in FIG. 3B, a cell CELL4 is formed to include active areas 310G, 310H, 310I and 310J. The active areas 310G and 310I are configured with respect to, for example, the active area 310C. The active areas 310H and 310J are configured with respect to, for example, the active area 310D.

For illustration, the active areas 310G and 310H overlap with each other, and the active areas 310I and 310J overlap with each other. In some embodiments, the active areas 310G-310J are disposed between the active area 310A and 310C. The configurations of the active areas 310G-310J in FIG. 3D are given for illustrative purposes. Various implements are within the contemplated scope of the present disclosure. For example, in some embodiments, the active areas 310G-310H are disposed next to the active areas 310A-310B/310E-310F, are configured with respect to, for example, the active areas 310A-310B. In various embodiments, a cell of another design includes more active areas than the cell CELL4 does for computing.

In some embodiments, as shown in FIG. 3D, the active areas 310A, 310C, 310E, 310G, and 310I are close to each other and further operate together with corresponding elements as the transistor M2 of FIG. 1. Similarly, the active areas 310B, 310D, 310F, 310H, and 310J are close to each other and further operate together with corresponding elements as the transistor M1 of FIG. 1. In some embodiments, the active areas 310A-310H are arranged in a portion having a width W3 larger than the widths W1 and W2.

With the configurations of FIG. 3D, in some embodiments, the cell CELL4 provides higher performance computing ability than the cell CELL1, the cell CELL2 and the cell CELL3 due to more active areas included in the cell for operations.

In some embodiments, the cell CELL4 has a cell height H3 along y direction. In some embodiments, the cell height H3 is triple of the cell height H1. The configurations of the cell CELL4 are given for illustrative purposes. Various implements of the cell CELL4 are within the contemplated scope of the present disclosure. For example, in some embodiments, the cell height H3 is N times of the cell height H1, in which N is an integer greater than 3.

The configurations of FIGS. 3A-3D are given for illustrative purposes. Various implements of FIGS. 3A-3D are within the contemplate scope of the present disclosure. For example, the widths W1, W2, W3 varies with the manufacturing processes of the integrated circuits.

Reference is now made to FIG. 4. FIG. 4 is a layout diagram in a plan view of part of an integrated circuit 400, in accordance with various embodiments. For illustration, the integrated circuit 400 includes cells CELL1a, CELL1b, CELL2a, and CELL3a. In some embodiments, the cells CELL1a-CELL1b are configured with respect to, for example, the cell CELL1 of FIG. 2B. The cell CELL2a is configured with respect to, for example, the cell CELL2 of FIG. 3B. The cell CELL3a is configured with respect to, for example, the cell CELL3 of FIG. 3C.

For illustration, the cell CELL1a abuts the cell CELL1b along x direction. As shown in FIG. 4, top most boundary lines of active areas of the cell CELL1a are aligned with top most boundary lines of active areas of the cell CELL1b along x direction. The cell CELL1a abuts the cell CELL2a along y direction. The cell CELL1b abuts the cell CELL3a along y direction. The cells CELL2a and CELL3a abut each other along x direction. In some embodiments, a top boundary line of at least one active area of the cell CELL2a is aligned with a top boundary line of at least one active area of the cell CELL3a along x direction. For example, top boundary lines of the active areas 310A-310B of the cell CELL2a are aligned with top boundary lines of the active areas 310A-310B of the cell CELL3a. Alternatively stated, one of active areas included in the cell CELL2a and one of active areas included in the cell CELL3a are disposed in the same row in the layout view.

In some embodiments, the alignment configurations of active areas included in multiple abutting cells of FIGS. 4-10 also include, for example, that bottom most boundary lines and/or central lines of active areas of multiple abutting cells align with each other. For the sake of simplicity, the particular portions, of active areas included in multiple abutting cells, referred as aligned with each other are omitted thereafter.

The configurations of FIG. 4 are given for illustrative purposes. Various implements are within the contemplated scope of the present disclosure. For example, in some embodiments, the active areas 310A-310B of the cell CELL2a and the active areas 310A-310B of the cell CELL3a are aligned with each other while active areas 310E-310F of the cell CELL2a and the active areas 310E-310F of the cell CELL3a are not aligned with each other along x direction.

Reference is now made to FIG. 5. FIG. 5 is a layout diagram in a plan view of part of an integrated circuit 500, in accordance with various embodiments. For illustration, the integrated circuit 500 includes cells CELL1c, CELL1d, CELL3b, and CELL4a. In some embodiments, the cells CELL1c-CELL1d are configured with respect to, for example, the cell CELL1 of FIG. 2B. The cell CELL3b is configured with respect to, for example, the cell CELL3 of FIG. 3C. The cell CELL4a is configured with respect to, for example, the cell CELL4 of FIG. 3D.

For illustration, the cell CELL1c abuts the cell CELL1d along y direction. The cells CELL1c and CELL1d abut on one side the cell CELL3b and abut the cell CELL4a on an opposite side, along x direction. In some embodiments, active areas 110A-110B of the cell CELL1c are aligned with active areas 310A-310B of the cell CELL3b and active areas 310H-310J of the cell CELL4a along x direction. Active areas 110A-110B of the cell CELL1d are aligned with active areas 310E-310F of the cell CELL3b and active areas 310E-310F of the cell CELL4a along x direction. In some embodiments, the active area 110A/110B of the cell CELL1c/CELL1d is aligned with one of active areas of the cell CELL4a and/or one of the cell CELL3b along x direction. Alternatively stated, in some embodiments, one of active areas included in the cell CELL1c and/or in the CELL1d, one of active areas included in the cell CELL3b, and one of active areas included in the cell CELL4a are disposed in the same row in the layout view.

The configurations of FIG. 5 are given for illustrative purposes. Various implements are within the contemplated scope of the present disclosure. For example, in some embodiments, the cell CELL3b abuts the cell CELL1c and CELL1b on a side and abuts the cell CELL4a on an opposite side.

Figure 6:
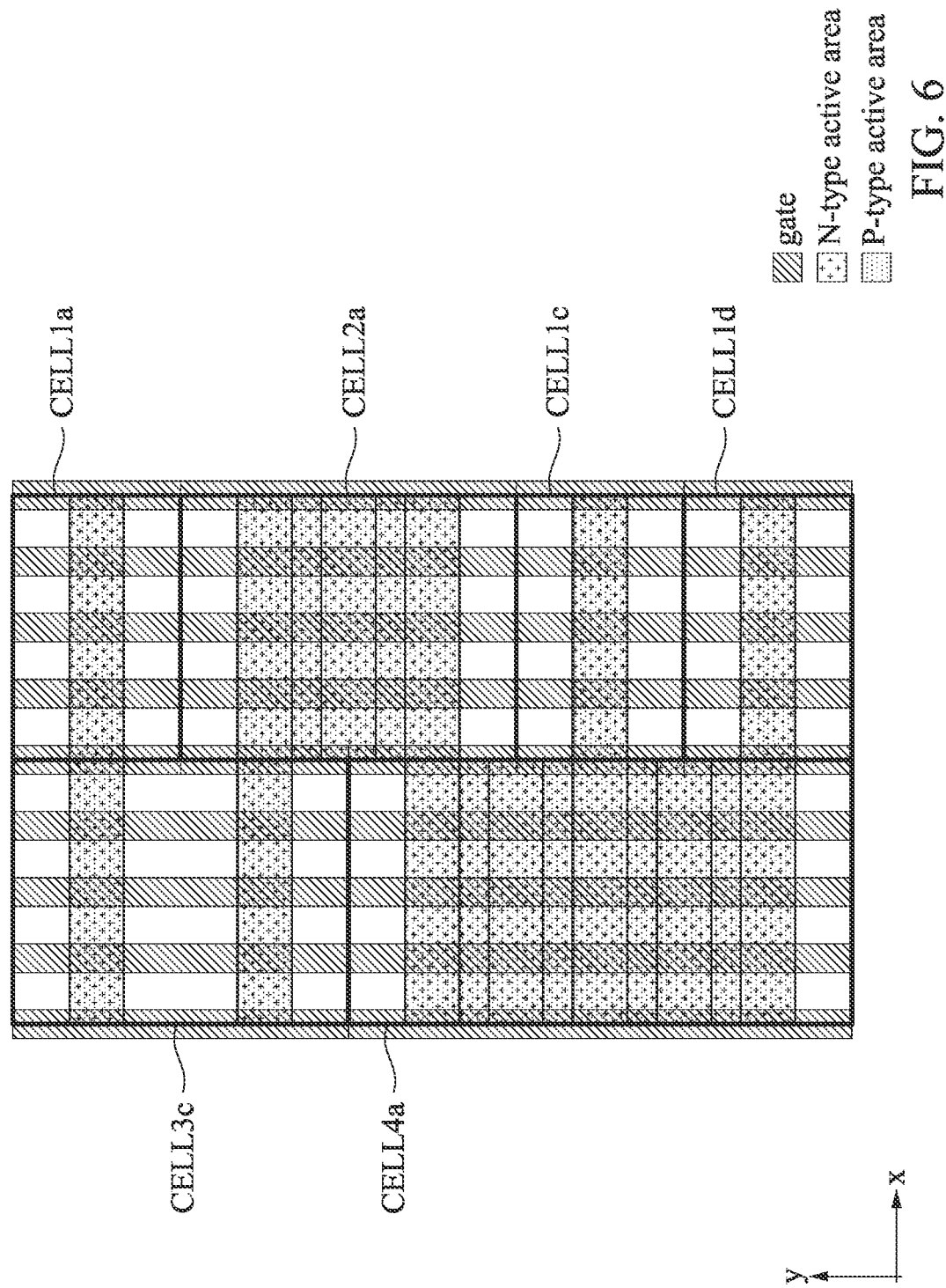
FIG. 6 is a layout diagram in a plan view of part of an integrated circuit, in accordance with various embodiments.

Reference is now made to FIG. 6. FIG. 6 is a layout diagram in a plan view of part of an integrated circuit 600, in accordance with various embodiments. With respect to the embodiments of FIG. 6, like elements in FIGS. 4 and 5 are designated with the same reference numbers for ease of understanding. The specific operations of similar elements, which are already discussed in detail in above paragraphs, are omitted herein for the sake of brevity, unless there is a need to introduce the co-operation relationship with the elements shown in FIG. 6.

Compared with the embodiments of the integrated circuit 500 of FIG. 5, for illustration, the integrated circuit 600 further includes the cells CELL1a, CELL2a, cell CELL3c and excludes the cell CELL3b. For illustration, the cell CELL2a is disposed along y direction between the cell CELL1a and the adjacent cells CELL1c and CELL1d. The cell CELL3C abuts the cell CELL1a along x direction and abuts the cell CELL4a along y direction. The cell CELL4a abuts the cells CELL1c, CELL1d and CELL2a along x direction.

As shown in FIG. 6, active areas 310A-310B of the cell CELL3c are aligned to the active areas 110A-110B of the cell CELL1a, and active areas 310E-310F of the cell CELL3c are aligned to the active areas 310A-310B of the cell CELL2a along x direction. The active areas 310E-310F of the cell CELL2a are aligned to the active areas 310A-310B of the cell CELL4a along x direction. Alternatively stated, the active areas 310E-310F of the cell CELL3c are disposed directly next to the active areas 310A-310B of the cell CELL4a along y direction in the layout view. The active areas 110A-110B of the cell CELL1a are disposed directly next to the active areas 310A-310B of the cell CELL2a along y direction in the layout view. The active areas 310E-310F of the cell CELL2a are disposed directly next to the active areas 110A-110B of the cell CELL1c along y direction in the layout view.

The configurations of FIG. 6 are given for illustrative purposes. Various implements are within the contemplated scope of the present disclosure. For example, in some embodiments, the active areas 310A-310B of the cell CELL3c and the active areas 110A-110B of the cell CELL1a are aligned with each other while active areas 310E-310F of the cell CELL3c and the active areas 310A-310B of the cell CELL2a are not aligned with each other along x direction.

Figure 7:
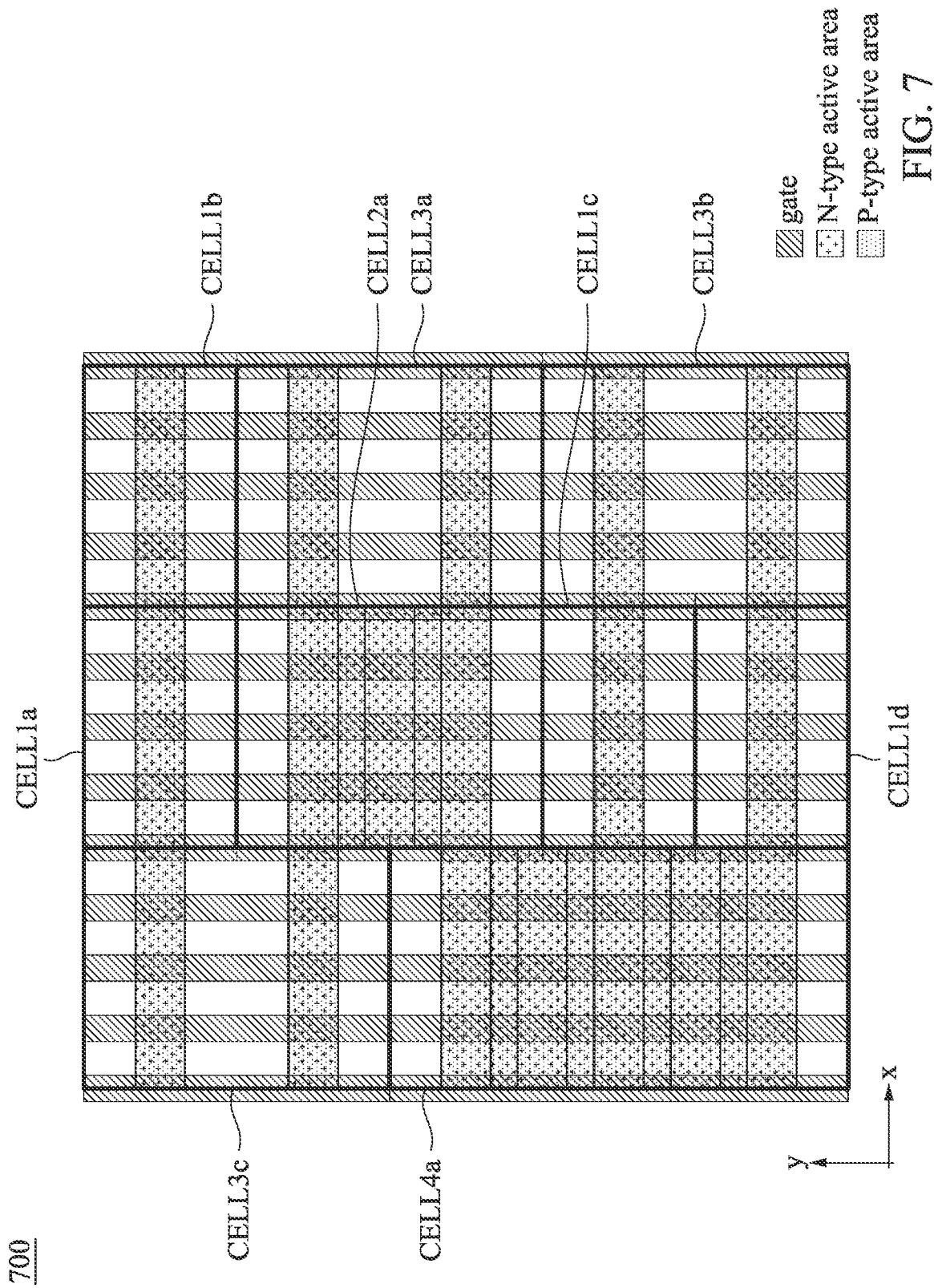
FIG. 7 is a layout diagram in a plan view of part of an integrated circuit, in accordance with various embodiments.

Reference is now made to FIG. 7. FIG. 7 is a layout diagram in a plan view of part of an integrated circuit 700, in accordance with various embodiments. With respect to the embodiments of FIG. 7, like elements in FIGS. 4-6 are designated with the same reference numbers for ease of understanding. The specific operations of similar elements, which are already discussed in detail in above paragraphs, are omitted herein for the sake of brevity, unless there is a need to introduce the co-operation relationship with the elements shown in FIG. 7.

Compared with the embodiments of the integrated circuit 600 in FIG. 6, the integrated circuit 700 further includes the cells CELL1b, CELL3a, and CELL3b. With reference as discussed above, the cell CELL1b and the cell CELL3a abut the cell CELL1a and the cell CELL2a respectively. Furthermore, the cell CELL3b abuts the cell CELL2a along y direction and abuts the cell CELL1c and the cell CELL1d along x direction.

As shown in FIG. 7, the active areas 310A-310B of the cell CELL3c are aligned with the active areas 110A-110B of the cell CELL1a and the active areas 110A-110B of the cell CELL1b. The active areas 310E-310F of the cell CELL3c are aligned with the active areas 310A-310B of the cell CELL2a and the active areas 310A-310B of the cell CELL3a. The active areas 310E-310F of the cell CELL2a are aligned with the active areas 310E-310F of the cell CELL3a and the active areas 310A-310B of the cell CELL4a.

In some approaches, active areas of a first conductivity type and active areas of a second conductivity type in cells are arranged in the same layer and separate from each other in y direction. Active areas of the same conductivity type in two adjacent cells of the cells are aligned in x direction. Moreover, along two opposite direction along y direction, cells of high computing performance have a half single cell height difference from cells of normal performance. Because of the cell height difference, when the cells of normal performance abut the cells of high computing performance along y direction, white spaces of half single cell height between the cells of normal performance and the cells of high computing performance are produced in the layout view. Accordingly, in such approaches, the layout of the integrated circuit suffers the area penalty due to the white spaces.

Compared with aforementioned approaches, with the configurations of the present disclosure, no white spaces are induced when cells abut with each other along y direction. Accordingly, the greater cell density and better layout flexibility are provided in the present disclosure.

The configurations of FIGS. 4-7 are given for illustrative purposes. Various implements are within the contemplated scope of the present disclosure. For example, in some embodiments, the cells CELL3a-CELL3c are replaced by the cell CELL2a in order to gain high computing performance.

Figure 8:
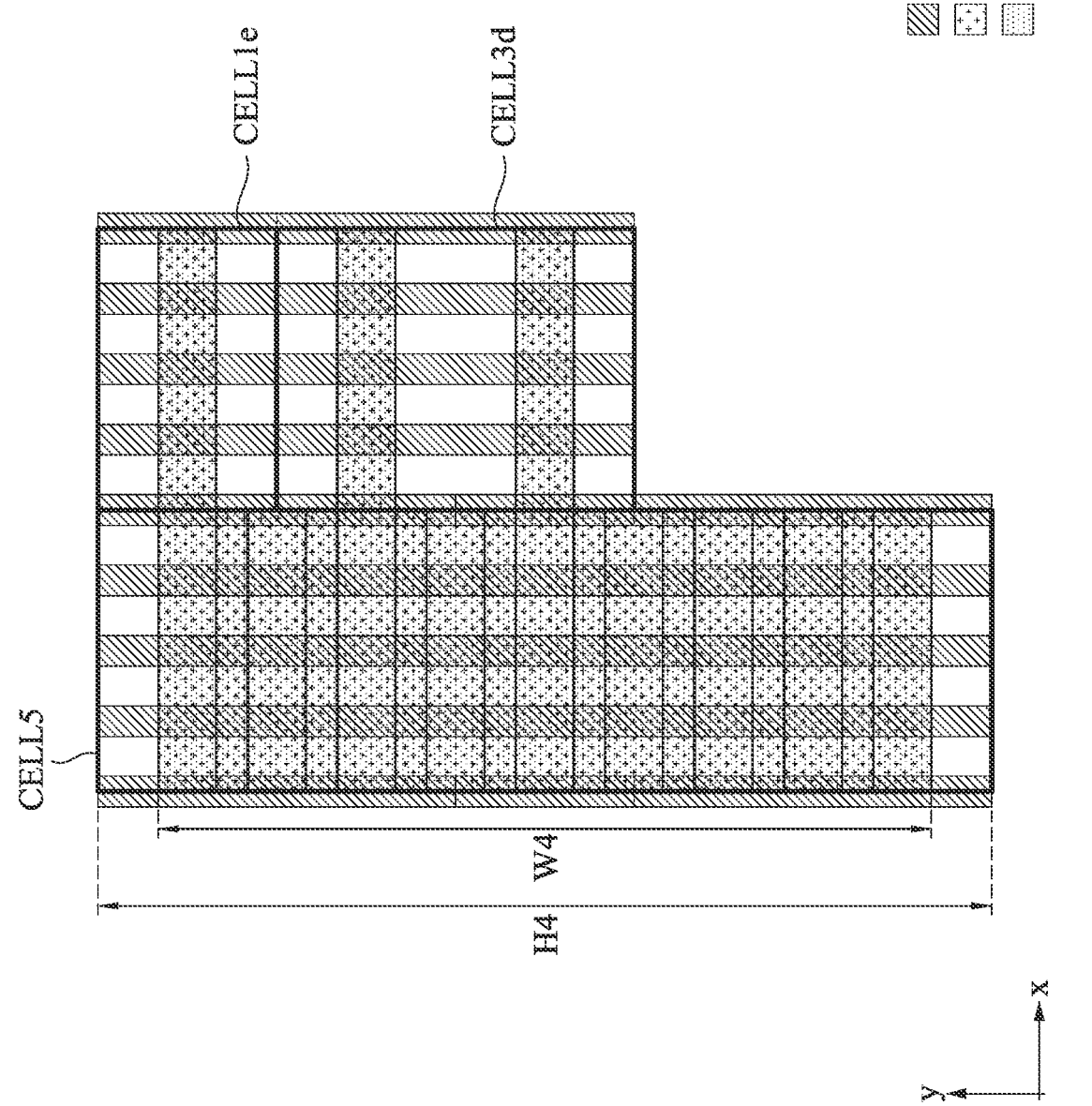
FIG. 8 is a layout diagram in a plan view of part of an integrated circuit, in accordance with various embodiments.

Reference is now made to FIG. 8. FIG. 8 is a layout diagram in a plan view of part of an integrated circuit 800, in accordance with various embodiments. For illustration, the integrated circuit 800 includes cells CELL1e, CELL3d, and CELL5. In some The cell CELL1e is configured with respect to, for example, the cell CELL1 of FIG. 2B. The cell CELL3d is configured with respect to, for example, the cell CELL3 of FIG. 3C.

As shown in FIG. 8, the cell CELL5 includes multiple first active areas of the first conductivity type (e.g., N-type) and multiple second active areas of the second conductivity type (e.g., P-type). The first active areas and the second active areas overlap with each other in the layout view. In some embodiments, the first active areas are configured with respect to, for example, the active areas 310A, 310C, and 310E of FIG. 3B. The second active areas are configured with respect to, for example, the active areas 310B, 310D, and 310F of FIG. 3B.

In some embodiments, the first active areas of the cell CELL5 are close to each other and further operate together with corresponding elements as the transistor M2 of FIG. 1. Similarly, the second active areas of the cell CELL5 are close to each other and further operate together with corresponding elements as the transistor M1 of FIG. 1. In some embodiments, the first active areas and the second active areas of the cell CELL5 are arranged in a portion having width W4 larger than the widths W1-W3 in the integrated circuit 800.

For illustration, the cell CELL5 has a cell height H4 along y direction. In some embodiments, the cell height H4 is five times larger than the cell height H1. The configurations of the cell CELL5 are given for illustrative purposes. Various implements of the cell CELL5 are within the contemplated scope of the present disclosure. For example, in some embodiments, the cell height H4 is a total of cell height of the cells abutting the cell CELL5.

With the configurations of the cell CELL5 in FIG. 8, in some embodiments, the cell CELL5 provides higher performance computing ability than the cells CELL1-CELL4 due to more active areas included in the cell for operations.

With continued reference to FIG. 8. The cell CELL1e abuts the cell CELL5 along x direction and abuts the cell CELL3d along y direction. The cell CELL3d abuts the cell CELL5 along x direction. In some embodiments, active areas 110A-110B of the cell CELL1e are aligned with one active area of the first active areas and one active area of the second active areas of the cell CELL5. Active areas 310A-310B and 310E-310F of the cell CELL3d are aligned with two active areas of the first active areas and two active areas of the second active areas of the cell CELL5.

Figure 9:
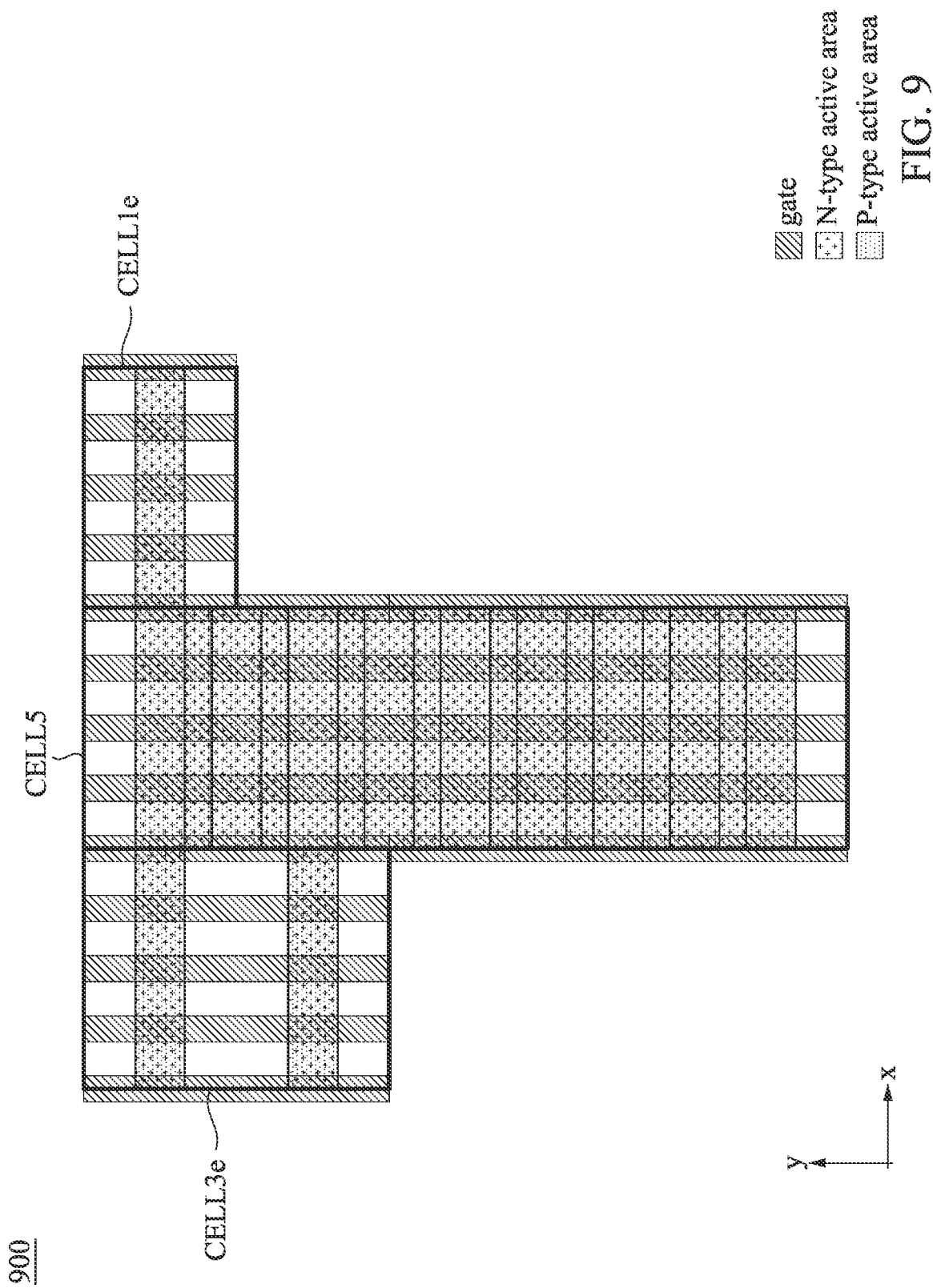
FIG. 9 is a layout diagram in a plan view of part of an integrated circuit, in accordance with various embodiments.

Reference is now made to FIG. 9. FIG. 9 is a layout diagram in a plan view of part of an integrated circuit 900, in accordance with various embodiments. With respect to the embodiments of FIG. 9, like elements in FIG. 8 are designated with the same reference numbers for ease of understanding. The specific operations of similar elements, which are already discussed in detail in above paragraphs, are omitted herein for the sake of brevity, unless there is a need to introduce the co-operation relationship with the elements shown in FIG. 9.

Compared with the embodiments of the integrated circuit 800 of FIG. 8, for illustration, the integrated circuit 900 further includes a cell CELL3e and excludes the cell CELL3d. In some embodiments, the cell CELL3e is configured with respect to, for example, the cell CELL3 of FIG. 3C.

For illustration, the cell CELL3e abuts the cell CELL5 along x direction. In some embodiments, active areas 310A-310B of the cell CELL3e are aligned with the one active area of the first active areas, the one active area of the second active areas of the cell CELL5, and the active areas 110A-110B of the cell CELL1e. Moreover, active areas 310E-310F of the cell CELL3e are aligned with another one active area of the first active areas and another one active area of the second active areas of the cell CELL5.

Figure 10:
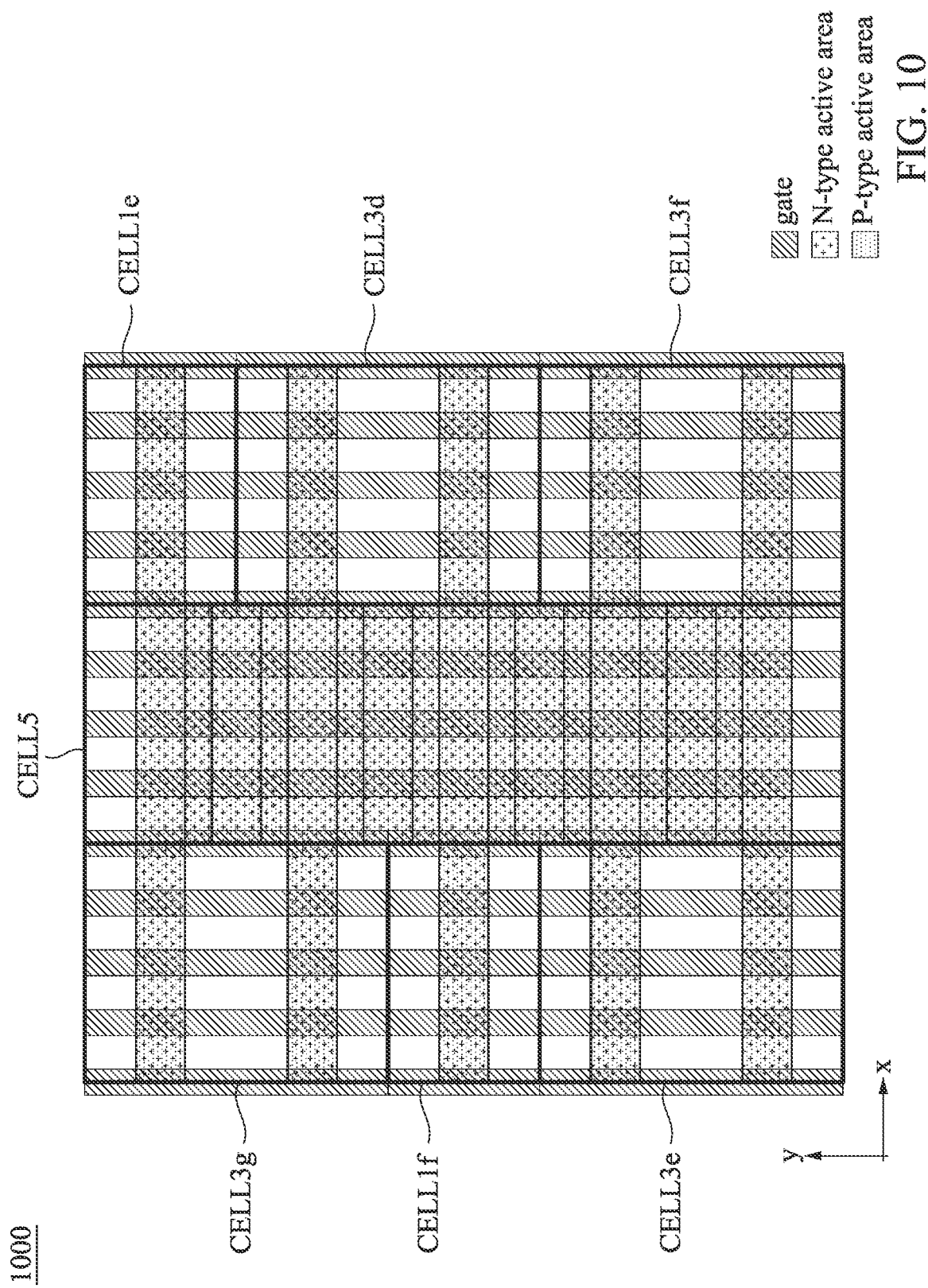
FIG. 10 is a layout diagram in a plan view of part of an integrated circuit, in accordance with various embodiments.

Reference is now made to FIG. 10. FIG. 10 is a layout diagram in a plan view of part of an integrated circuit 1000, in accordance with various embodiments. With respect to the embodiments of FIG. 10, like elements in FIGS. 8 and 9 are designated with the same reference numbers for ease of understanding. The specific operations of similar elements, which are already discussed in detail in above paragraphs, are omitted herein for the sake of brevity, unless there is a need to introduce the co-operation relationship with the elements shown in FIG. 10.

Compared with the embodiments of the integrated circuit 900 in FIG. 9, the integrated circuit 1000 further includes the cells CELL3d, cells CELL1f, CELL3f, and CELL3g. In some embodiments, the cell CELL1f is configured with respect to, for example, the cell CELL1 of FIG. 2B. The cells CELL3f and CELL3g are configured with respect to, for example, the cell CELL3 of FIG. 3C.

For illustration, the cell CELL3d abuts the cell CELL5 along x direction and the cell CELL3f along y direction. The cell CELL3f abuts the cell CELL5 along x direction. The cell CELL1f is disposed between the cell CELL3e and the cell CELL3g and abuts the cell CELL5 along x direction. The cell CELL3g abuts the cell if along the y direction and the cell CELL5 along x direction.

As shown in FIG. 10, the active areas 310E-310F of the cell CELL3e are aligned the another one active area of the first active areas, the another one active area of the second active areas of the cell CELL5, and active areas 310A-310B of the cell CELL3d. Active areas 110A-110B of the cell CELL1f are aligned with still another one of the first active areas of the CELL5, still another one of the second active areas of the CELL5, and active areas 310E-310F of the cell CELL3d. Moreover, active areas 310A-310B are aligned with still another active areas of the first active areas of the CELL5, still another one of the second active areas of the CELL5, and active areas 310A-310B of the cell CELL3f. Active areas 310E-310F are aligned with still another active areas of the first active areas of the CELL5, still another one of the second active areas of the CELL5, and active areas 310E-310F of the cell CELL3f. Alternatively stated, a first portion of the first active areas of the cell CELL5 and a first portion of the second active areas of the cell CELL5 are aligned with active areas included in the cells abutting the cell CELL5. A second portion of the first active areas of the cell CELL5 and a second portion of the second active areas of the cell CELL5 are not aligned with active areas included in the cells abutting the cell CELL5.

In some embodiments, a total number of the first active areas and the second active areas of the cell CELL5 is greater than a total number of active areas included in the cells CELL1e, CELL3d, and CELL3f. Similarly, the total number of the first active areas and the second active areas of the cell CELL5 is greater than a total number of active areas included in the cells CELL3e, CELL1f, and CELL3g.

In some approaches, for example, high computing performance cells include, in a layer, active areas of a first conductivity type and active areas of a second conductivity type arranged next to the active areas of the first conductivity type. When two high computing performance cells abut each other along y direction, there is no space for extra active areas being arranged between the active areas of the first conductivity type and the active areas of the second conductivity type.

In contrast to such approaches mentioned above, with the configuration of the present disclosure, when two high computing performance cells abut each other along y direction and have a same total cell height as aforementioned approaches, extra active areas of the first conductivity type can be arranged next to the active areas of the first conductivity type of the two high computing performance cells in the first layer, and extra active areas of the second conductivity type can be arranged next to the active areas of the second conductivity type of the two high computing performance cells in the second layer. Alternatively stated, more active areas for operation can be added to integrated circuits, compared to the some approaches. Accordingly, the present disclosure provides better flexibility of layout and performance of cells in integrated circuits.

The configurations of FIGS. 8-10 are given for illustrative purposes. Various implements are within the contemplated scope of the present disclosure. For example, in some embodiments, the numbers of the first active areas and the second active areas of the cell CELL5 are different from each other.

Figure 11:
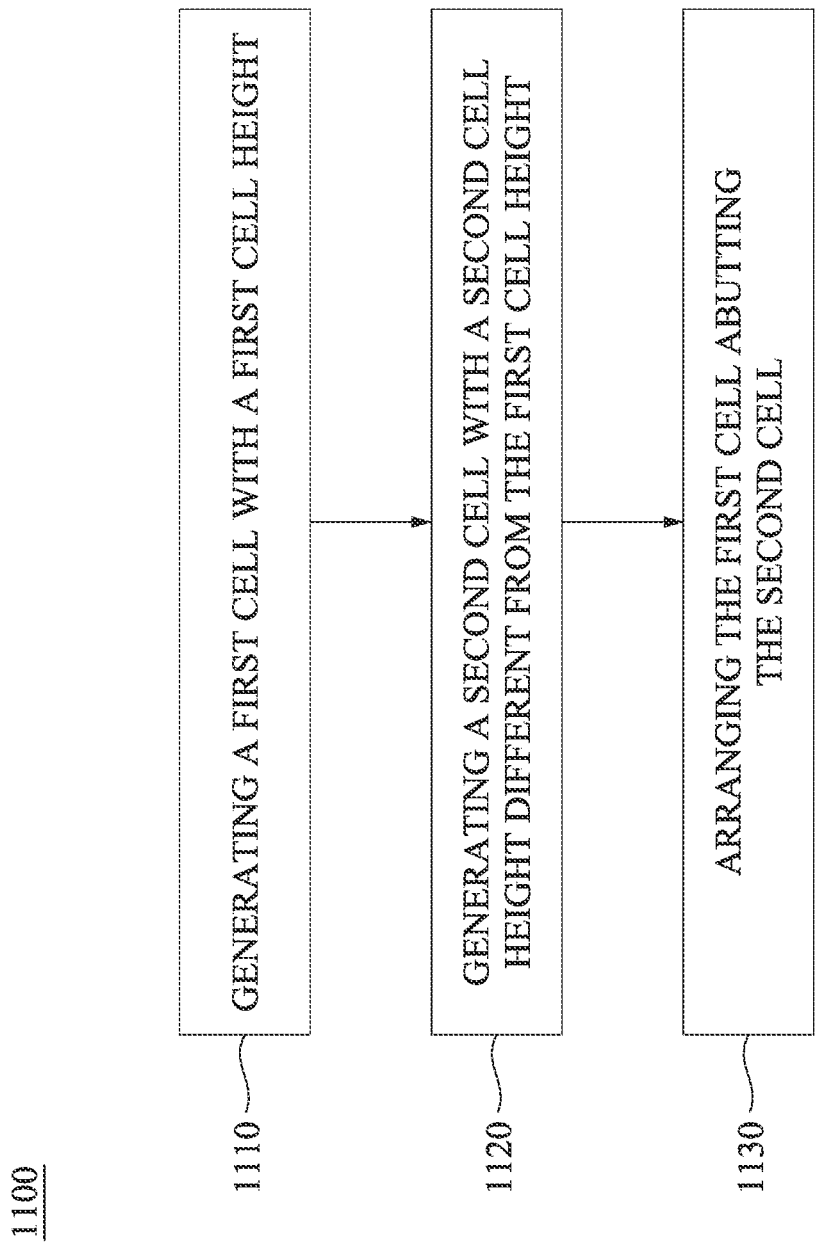
FIG. 11 is a flow chart of a method of generating a layout design for fabricating an integrated circuit, in accordance with some embodiments of the present disclosure.

Reference is now made to FIG. 11. FIG. 11 is a flow chart of a method 1100 of generating a layout design for fabricating the integrated circuit 100, 300, 400, 500, 600, 700, 800, 900, or 1000, in accordance with some embodiments of the present disclosure. It is understood that additional operations can be provided before, during, and after the processes shown by FIG. 11, and some of the operations described below can be replaced or eliminated, for additional embodiments of the method 1100. The method 1100 includes operations S1110-S1130 that are described below with reference to FIG. 7.

In operation 1110, generating the cell CELL1a with the cell height H1 is performed. In some embodiments, the cell CELL1a includes the active area 110A and the active area 110B overlapping the active area 110A, as shown in FIG. 2B.

In operation 1120, generating the cell CELL3c with the cell height H2 is performed. In some embodiments, the cell CELL3c includes the active areas 310A-310B and the active areas 310E-310F overlapping the active areas 310A-310B.

In operation 1130, arranging the cell CELL1a abutting the cell CELL3c is performed. In some embodiments, the active area 110A and one of the active areas 310A-310B extend in a first row, and/or the active area 110B and one of the active areas 310A-310B extend in the first row.

In some embodiments, the method 1100 further includes operations of generating the cell CELL2a abutting the cell CELL1a and the cell CELL3c. Specifically, the cell CELL3c includes the active areas 310A, 310C and 310E and the active areas 310B, 310D, and 310F overlapping the active areas 310A, 310C and 310E, separately. In some embodiments, the number of the active areas 310A, 310C and 310E of the cell CELL2a is greater than the number of the active areas 310A and 310E of the cell CELL3c. Moreover, one of the active areas 310A, 310C and 310E of the cell CELL2a and one of the active areas 310A and 310E extend in a second row different from the first row. In various embodiments, the cell CELL2a and the cell CELL3c have the same cell height, for example, the cell height H2.

In some embodiments, the method 1100 further includes operations of generating the cell CELL4a, in which the cell CELL4a includes the active areas 310A, 310C, 310E, 310G, and 310I and the active areas 310B, 310D, 310F, 310H, and 310J overlapping the active areas 310A, 310C, 310E, 310G, and 310I. The method 1100 further includes operations of arranging the cell CELL4a abuts the cells CELL1a, CELL2a, and CELL3c. In some embodiments, the cell CELL4a includes a greater number of active areas than that included in the cell CELL2a, and the cell CELL2a includes a greater number of active areas than that included in the cell CELL3c.

In some embodiments, the method 1100 further includes operations of manufacturing at least one element of the integrated circuit 100, 300, 400, 500, 600, 700, 800, 900, or 1000, based on the layout generated through the operations mentioned above.

Figure 12:
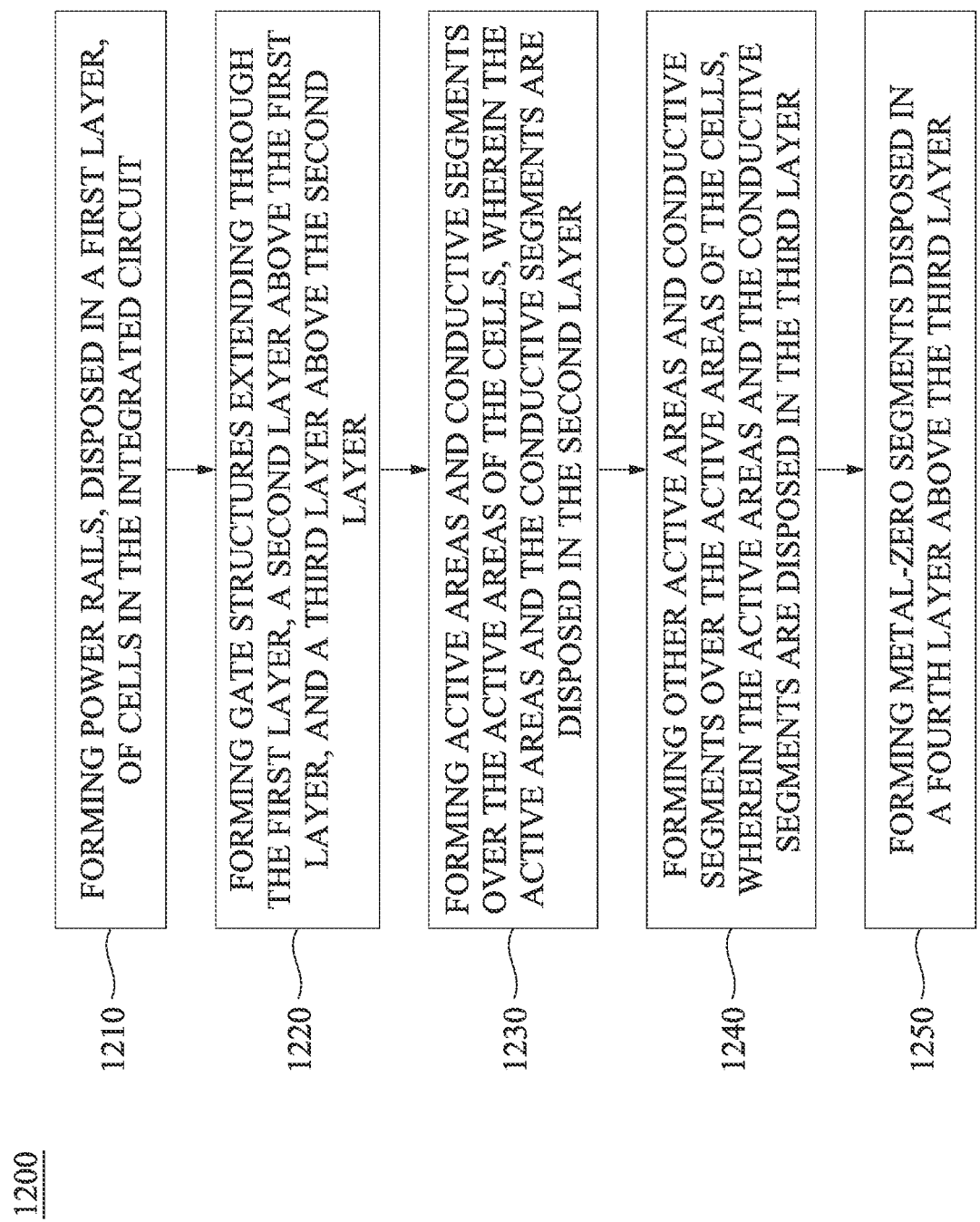
FIG. 12 is a flow chart of a method of fabricating an integrated circuit based on the layout design generated by the method of FIG. 11, in accordance with some embodiments of the present disclosure.

Reference is now made to FIG. 12. FIG. 12 is a flow chart of a method 1200 of fabricating the integrated circuit 100, 300, 400, 500, 600, 700, 800, 900, or 1000 based on the layout design generated by the method 1100 of FIG. 11, in accordance with some embodiments of the present disclosure. It is understood that additional operations can be provided before, during, and after the processes shown by FIG. 11, and some of the operations described below can be replaced or eliminated, for additional embodiments of the method 1200. The method 1200 includes operations S1210-S1250 that are described below with reference to FIGS. 3A and 4.

In operation 1210, the power rails 341a-342a and 341c-342c of the cells CELL1a, CELL1b, CELL2a, and CELL3a are formed and disposed in a first layer.

In operation 1220, the gates 330a-330c are formed through the first layer, the second layer above the first layer, and the third layer above the second layer. In some embodiments, each one of the gates 330a-330c includes an interfacial layer (not shown) and a polysilicon (or poly) layer (not shown) over the interfacial layer. In some embodiments, the gates 330a-330c further include a gate dielectric layer (not shown) and a metal gate layer (not shown) disposed between the interfacial layer and the poly layer. In some embodiments, the gates 330a-330c includes one or more metal layers in place of the poly layer. In various embodiments, the interfacial layer includes a dielectric material including, for example, silicon oxide ($SiO_2$) or silicon oxynitride (SiON), and is able to be formed by chemical oxidation, thermal oxidation, atomic layer deposition (ALD), chemical vapor deposition (CVD), and/or other suitable methods. In some embodiments, the polysilicon layer is formed by suitable deposition processes including, for example, low-pressure chemical vapor deposition (LPCVD) and plasma-enhanced CVD (PECVD). In some embodiments, the gate dielectric layer uses a high-k dielectric material including, for example, hafnium oxide ($HfO_2$), $Al_2O_3$, lanthanide oxides, $TiO_2$, HfZrO, $Ta_2O_3$, $HfSiO_4$, $ZrO_2$, $ZrSiO_2$, combinations thereof, or other suitable material, and the gate dielectric layer is formed by ALD and/or other suitable methods. The metal gate layer includes a p-type work function metal or an n-type work function metal, and is deposited by CVD, PVD, and/or other suitable process. Exemplary p-type work function metals include TiN, TaN, Ru, Mo, Al, WN, $ZrSi_2$, $MoSi_2$, $TaSi_2$, $NiSi_2$, WN, other suitable p-type work function materials, or combinations thereof. Exemplary n-type work function metals include Ti, Ag, TaAl, TaAlC, TiAlN, TaC, TaCN, TaSiN, Mn, Zr, other suitable n-type work function materials, or combinations thereof. The one or more metal layers use aluminum (Al), tungsten (W), copper (Cu), cobalt (Co), and/or other suitable materials; and are formed by CVD, PVD, plating, and/or other suitable processes. The formations and/or materials associated with the gates 330a-330c are given for illustrative purposes. Various formations and/or materials associated with the gates 330a-330c are within the contemplated scope of the present disclosure.

In some embodiments, the gate 330a-330c are implemented by being included in multilayer stacks, for example, including structures of round/square wire, nanoslab, nanosheet, multi-bridge channel, nano-ring or any other suitable kinds of the nano structures.

In operation 1230, the active regions 311a-311c and the conductive segments 321a-321c, 322a-322c of the cells of FIG. 4 are formed in the second layer. In some embodiments, the conductive segments 321a-321c, 322a-322c are formed after the formation of the active regions 311a-311c.

In some embodiments, after the formation of the active regions 311a-311c and the conductive segments 321a-321c, 322a-322c, an isolation layer is formed above the formation of the active regions 311a-311c and the conductive segments 321a-321c, 322a-322c, in order to electrically isolate the conductive elements in the second layer and the following third layer.

In operation 1240, the active regions 311*a*-311*c* and the conductive segments 321*a*-321*c*, 322*a*-322*c* of the cells of FIG. 4 are formed in the second layer. In some embodiments, the conductive segments 321*a*-321*c*, 322*a*-322*c* are formed after the formation of the active regions 311*a*-311*c*.

As discussed above, in some embodiments, the active areas of a high performance cell (i.e., the cell CELL2*a* of FIG. 4) and the active areas of a normal cell (i.e., the cells CELL1*a*-CELL1*b*, and CELL3*a*) are formed and/or patterned in the same procedure.

In operation 1250, the metal-zero segments 151-153 are formed. In some embodiments, metal-one segments arranged above the metal-zero segments are formed. The arrangements of metal-zero segments, metal-one segments and/or more metal layers are on the basis of actual metal routing of the integrated circuit.

In some embodiments, the method 1200 also includes forming vias between conductive elements (i.e., the via 161 coupled between the power rail 141 and the conductive segment 123, etc.) for implementing the integrated circuit.

Figure 13:
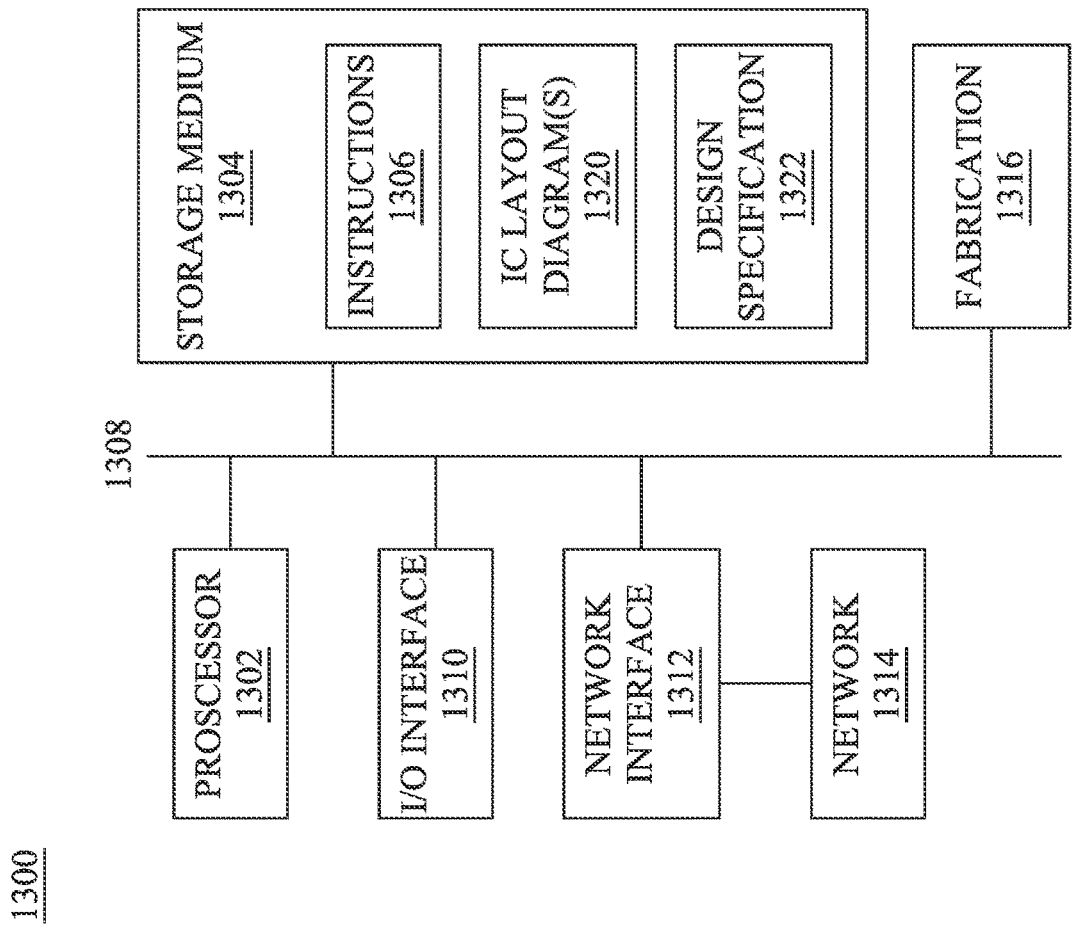
FIG. 13 is a block diagram of a system for designing the integrated circuit layout design, in accordance with some embodiments of the present disclosure.

FIG. 13 is a block diagram of a system for designing the integrated circuit layout design, in accordance with some embodiments of the present disclosure. One or more operations of the method 1100 as discussed above with respect to FIG. 11 are implementable using the IC device design system 1300, in accordance with some embodiments.

In some embodiments, IC device design system 1300 is a computing device including a hardware processor 1302 and a non-transitory computer-readable storage medium 1304. Non-transitory computer-readable storage medium 1304, amongst other things, is encoded with, i.e., stores, computer program codes, i.e., a set of executable instructions 1306. Execution of instructions 1306 by the hardware processor 1302 represents (at least in part) an IC device design system which implements a portion or all of, e.g., the method 1100 discussed above with respect to FIG. 11. (hereinafter, the noted processes and/or methods).

The processor 1302 is electrically coupled to non-transitory computer-readable storage medium 1304 via a bus 1308. The processor 1302 is also electrically coupled to an I/O interface 1310 and a fabrication tool 1316 by bus 1308. A network interface 1313 is also electrically connected to processor 1302 via bus 1308. Network interface 1313 is connected to a network 1314, so that processor 1302 and non-transitory, computer-readable storage medium 1304 are capable of being connected to external elements via network 1314. Processor 1302 is configured to execute the instructions 1306 encoded in non-transitory computer-readable storage medium 1304 in order to cause IC device design system 1300 to be usable for performing a portion or all of the noted processes and/or methods. In one or more embodiments, processor 1302 is a central processing unit (CPU), a multi-processor, a distributed processing system, an application specific integrated circuit (ASIC), and/or a suitable processing unit.

In one or more embodiments, non-transitory computer-readable storage medium 1304 is an electronic, magnetic, optical, electromagnetic, infrared, and/or a semiconductor system (or apparatus or device). For example, non-transitory computer-readable storage medium 1304 includes a semiconductor or solid-state memory, a magnetic tape, a removable computer diskette, a random access memory (RAM), a read-only memory (ROM), a rigid magnetic disk, and/or an optical disk. In one or more embodiments using optical disks, non-transitory computer-readable storage medium 1304 includes a compact disk-read only memory (CD-ROM), a compact disk-read/write (CD-R/W), and/or a digital video disc (DVD).

In one or more embodiments, non-transitory computer-readable storage medium 1304 stores the instructions 1306 configured to cause IC device design system 1300 to be usable for performing a portion or all of the noted processes and/or methods. In one or more embodiments, non-transitory computer-readable storage medium 1304 also stores information which facilitates performing a portion or all of the noted processes and/or methods. In various embodiments, non-transitory computer-readable storage medium 1304 stores one or a combination of at least one IC layout designs 1320 or at least one design specification 1322, each discussed above with respect to FIGS. 2B, 3B-10 and the method 1100 in FIG. 11.

IC device design system 1300 includes I/O interface 1310. I/O interface 1310 is coupled to external circuitry. In various embodiments, I/O interface 1310 includes one or a combination of a keyboard, keypad, mouse, trackball, trackpad, display, touchscreen, and/or cursor direction keys for communicating information and commands to and/or from processor 1302.

IC device design system 1300 also includes network interface 1313 coupled to processor 1302. Network interface 1313 allows IC device design system 1300 to communicate with network 1314, to which one or more other computer systems are connected. Network interface 1313 includes wireless network interfaces such as BLUETOOTH, WIFI, WIMAX, GPRS, or WCDMA; or wired network interfaces such as ETHERNET, USB, or IEEE-1364. In one or more embodiments, a portion or all of the noted processes and/or methods, is implemented in two or more systems 1300.

IC device design system 1300 also includes the fabrication tool 1316 coupled to processor 1302. The fabrication tool 1316 is configured to fabricate integrated circuits, e.g., the integrated circuit 100 illustrated in FIG. 1, according to the design files processed by the processor 1302.

IC device design system 1300 is configured to receive information through I/O interface 1310. The information received through I/O interface 1310 includes one or a combination of at least one design rule instructions, at least one set of criteria, at least one design rule, at least one DRM, and/or other parameters for processing by processor 1302. The information is transferred to processor 1302 via bus 1308. IC device design system 1300 is configured to transmit and/or receive information related to a user interface through I/O interface 1310.

In some embodiments, a portion or all of the noted processes and/or methods is implemented as a standalone software application for execution by a processor. In some embodiments, a portion or all of the noted processes and/or methods is implemented as a software application that is a part of an additional software application. In some embodiments, a portion or all of the noted processes and/or methods is implemented as a plug-in to a software application. In some embodiments, at least one of the noted processes and/or methods is implemented as a software application that is a portion of an EDA tool. In some embodiments, an IC layout diagram is generated using a tool such as VIRTUOSO® available from CADENCE DESIGN SYSTEMS, Inc., or another suitable layout generating tool.

In some embodiments, the processes are realized as functions of a program stored in a non-transitory computer-readable recording medium. Examples of a non-transitory computer-readable recording medium include, but are not limited to, external/removable and/or internal/built-in storage or memory unit, e.g., one or more of an optical disk, such as a DVD, a magnetic disk, such as a hard disk, a semiconductor memory, such as a ROM, a RAM, a memory card, and the like.

By being usable to implement one or more operations of the method 1100 in FIG. 11, IC device design system 1300 and a non-transitory computer-readable storage medium, e.g., non-transitory computer-readable storage medium 1304, enable the benefits discussed above with respect to the method 1100 in FIG. 11.

Figure 14:
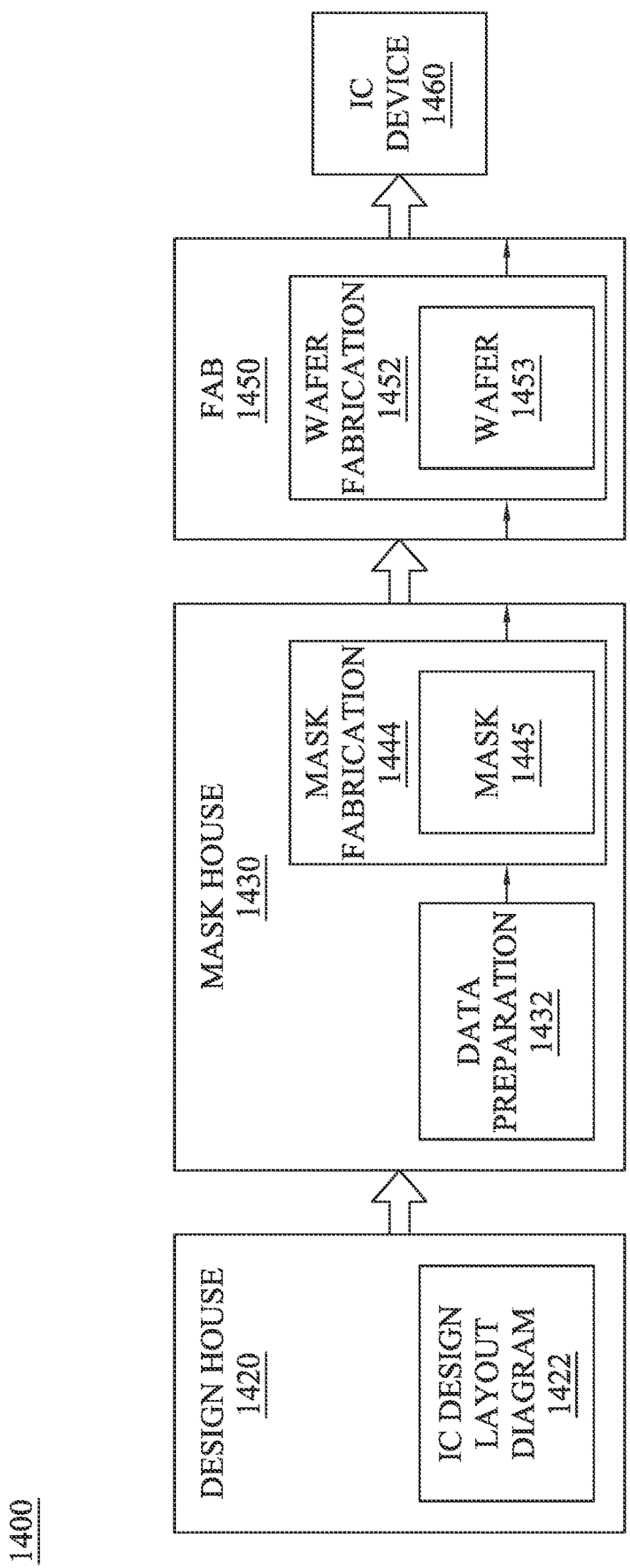
FIG. 14 is a block diagram of an integrated circuit manufacturing system, and an integrated circuit manufacturing flow associated therewith, in accordance with some embodiments.

FIG. 14 is a block diagram of IC manufacturing system 1400, and an IC manufacturing flow associated therewith, in accordance with some embodiments of the present disclosure. In some embodiments, based on a layout design, at least one of (A) one or more semiconductor masks or (B) at least one component in a layer of a semiconductor integrated circuit is fabricated using the IC manufacturing system 1400.

In FIG. 14, the IC manufacturing system 1400 includes entities, such as a design house 1420, a mask house 1430, and an IC manufacturer/fabricator ("fab") 1450, that interact with one another in the design, development, and manufacturing cycles and/or services related to manufacturing an IC device 1460. The entities in system 1400 are connected by a communications network. In some embodiments, the communications network is a single network. In some embodiments, the communications network is a variety of different networks, such as an intranet and the Internet. The communications network includes wired and/or wireless communication channels. Each entity interacts with one or more of the other entities and provides services to and/or receives services from one or more of the other entities. In some embodiments, two or more of design house 1420, mask house 1430, and IC fab 1450 is owned by a single larger company. In some embodiments, two or more of design house 1420, mask house 1430, and IC fab 1450 coexist in a common facility and use common resources.

Design house (or design team) 1420 generates an IC design layout diagram (or design) 1422 based on the method 1100 in FIG. 11, discussed above with respect to FIGS. 2B, 3B-10. IC design layout diagram 1422 includes various geometrical patterns that correspond to patterns of metal, oxide, or semiconductor layers that make up the various components of IC device 1460 to be fabricated. The various layers combine to form various IC features. For example, a portion of IC design layout diagram 1422 includes various IC features, such as an active area, gate electrode, source and drain, metal lines or vias of an interlayer interconnection, and openings for bonding pads, to be formed in a semiconductor substrate (such as a silicon wafer) and various material layers disposed on the semiconductor substrate. Design house 1420 implements a proper design procedure including the method 1100 in FIG. 11, discussed above with respect to FIGS. 2B, 3B-10, to form IC design layout diagram 1422. The design procedure includes one or more of logic design, physical design or place and route. IC design layout diagram 1422 is presented in one or more data files having information of the geometrical patterns. For example, IC design layout diagram 1422 can be expressed in a GDSII file format or DFII file format.

Mask house 1430 includes data preparation 1432 and mask fabrication 1444. Mask house 1430 uses IC design layout diagram 1422 to manufacture one or more masks 1445 to be used for fabricating the various layers of IC device 1460 according to IC design layout diagram 1422. Mask house 1430 performs mask data preparation 1432, where IC design layout diagram 1422 is translated into a representative data file ("RDF"). Mask data preparation 1432 provides the RDF to mask fabrication 1444. Mask fabrication 1444 includes a mask writer. A mask writer converts the RDF to an image on a substrate, such as a mask (reticle) 1445 or a semiconductor wafer 1453. The design layout diagram 1422 is manipulated by mask data preparation 1432 to comply with particular characteristics of the mask writer and/or requirements of IC fab 1450. In FIG. 14, mask data preparation 1432 and mask fabrication 1444 are illustrated as separate elements. In some embodiments, mask data preparation 1432 and mask fabrication 1444 are collectively referred to as mask data preparation.

In some embodiments, mask data preparation 1432 includes optical proximity correction (OPC) which uses lithography enhancement techniques to compensate for image errors, such as those that can arise from diffraction, interference, other process effects and the like. OPC adjusts IC design layout diagram 1422. In some embodiments, mask data preparation 1432 includes further resolution enhancement techniques (RET), such as off-axis illumination, sub-resolution assist features, phase-shifting masks, other suitable techniques, and the like or combinations thereof. In some embodiments, inverse lithography technology (ILT) is also used, which treats OPC as an inverse imaging problem.

In some embodiments, mask data preparation 1432 includes a mask rule checker (MRC) that checks the IC design layout diagram 1422 that has undergone processes in OPC with a set of mask creation rules which contain certain geometric and/or connectivity restrictions to ensure sufficient margins, to account for variability in semiconductor manufacturing processes, and the like. In some embodiments, the MRC modifies the IC design layout diagram 1422 to compensate for limitations during mask fabrication 1444, which may undo part of the modifications performed by OPC in order to meet mask creation rules.

In some embodiments, mask data preparation 1432 includes lithography process checking (LPC) that simulates processing that will be implemented by IC fab 1450 to fabricate IC device 1460. LPC simulates this processing based on IC design layout diagram 1422 to create a simulated manufactured device, such as IC device 1460. The processing parameters in LPC simulation can include parameters associated with various processes of the IC manufacturing cycle, parameters associated with tools used for manufacturing the IC, and/or other aspects of the manufacturing process. LPC takes into account various factors, such as aerial image contrast, depth of focus ("DOF"), mask error enhancement factor ("MEEF"), other suitable factors, and the like or combinations thereof. In some embodiments, after a simulated manufactured device has been created by LPC, if the simulated device is not close enough in shape to satisfy design rules, OPC and/or MRC are be repeated to further refine IC design layout diagram 1422.

It should be understood that the above description of mask data preparation 1432 has been simplified for the purposes of clarity. In some embodiments, data preparation 1432 includes additional features such as a logic operation (LOP) to modify the IC design layout diagram 1422 according to manufacturing rules. Additionally, the processes applied to IC design layout diagram 1422 during data preparation 1432 may be executed in a variety of different orders.

After mask data preparation 1432 and during mask fabrication 1444, a mask 1445 or a group of masks 1445 are fabricated based on the modified IC design layout diagram 1422. In some embodiments, mask fabrication 1444 includes performing one or more lithographic exposures based on IC design layout diagram 1422. In some embodiments, an electron-beam (e-beam) or a mechanism of multiple e-beams is used to form a pattern on a mask (photomask or reticle) 1445 based on the modified IC design layout diagram 1422. Mask 1445 can be formed in various technologies. In some embodiments, mask 1445 is formed using binary technology. In some embodiments, a mask pattern includes opaque regions and transparent regions. A radiation beam, such as an ultraviolet (UV) beam, used to expose the image sensitive material layer (e.g., photoresist) which has been coated on a wafer, is blocked by the opaque region and transmits through the transparent regions. In one example, a binary mask version of mask 1445 includes a transparent substrate (e.g., fused quartz) and an opaque material (e.g., chromium) coated in the opaque regions of the binary mask. In another example, mask 1445 is formed using a phase shift technology. In a phase shift mask (PSM) version of mask 1445, various features in the pattern formed on the phase shift mask are configured to have proper phase difference to enhance the resolution and imaging quality. In various examples, the phase shift mask can be attenuated PSM or alternating PSM. The mask(s) generated by mask fabrication 1444 is used in a variety of processes. For example, such a mask(s) is used in an ion implantation process to form various doped regions in semiconductor wafer 1453, in an etching process to form various etching regions in semiconductor wafer 1453, and/or in other suitable processes.

IC fab 1450 includes wafer fabrication 1452. IC fab 1450 is an IC fabrication business that includes one or more manufacturing facilities for the fabrication of a variety of different IC products. In some embodiments, IC Fab 1450 is a semiconductor foundry. For example, there may be a manufacturing facility for the front end fabrication of a plurality of IC products (front-end-of-line (FEOL) fabrication), while a second manufacturing facility may provide the back end fabrication for the interconnection and packaging of the IC products (back-end-of-line (BEOL) fabrication), and a third manufacturing facility may provide other services for the foundry business.

IC fab 1450 uses mask(s) 1445 fabricated by mask house 1430 to fabricate IC device 1460. Thus, IC fab 1450 at least indirectly uses IC design layout diagram 1422 to fabricate IC device 1460. In some embodiments, semiconductor wafer 1453 is fabricated by IC fab 1450 using mask(s) 1445 to form IC device 1460. In some embodiments, the IC fabrication includes performing one or more lithographic exposures based at least indirectly on IC design layout diagram 1422. Semiconductor wafer 1453 includes a silicon substrate or other proper substrate having material layers formed thereon. Semiconductor wafer 1453 further includes one or more of various doped regions, dielectric features, multi-level interconnects, and the like (formed at subsequent manufacturing steps).

As described above, the integrated circuit in the present disclosure includes cells of different cell heights. By implementing the complementary field-effect transistor structure, the white spaces between normal cells and high performance cells abutting the normal cells are eliminated. Accordingly, the present disclosure provides the integrated circuit with high cell density and good layout flexibility.

In some embodiments, an integrated circuit is disclosed, including a first transistor of a first conductivity type including a first active area extending in a first direction; a second transistor of the first conductivity type including at least two second active areas extending in the first direction and a first gate stripe crossing the at least two second active areas; and a third transistor of a second conductivity type that is stacked on the second transistor and includes at least two third active areas arranged above the at least two second active areas. A top most boundary line of the first active area is aligned with a top most boundary line of one of the at least two third active areas in a layout view. In some embodiments, the first conductivity type is N type, and the second conductivity type is P type. In some embodiments, the first transistor further includes a fourth active area separate from the first active area in a second direction different from the first direction. In some embodiments, a cell height of a first cell including the first transistor is equal to a cell height of a second cell including the second and third transistors. In some embodiments, a bottom most boundary line of the fourth active area is aligned with a bottom most boundary line of one of the at least two third active areas in the layout view. In some embodiments, a cell height of a first cell including the first transistor is different from a cell height of a second cell including the second and third transistors. In some embodiments, the integrated circuit further includes a fourth transistor of the second conductivity type that is stacked under the first transistor and includes a fourth active area extending in the first direction and a second gate stripe extending in a second direction different from the first direction to pass across the fourth active area. In some embodiments, the integrated circuit further includes fifth and sixth transistors of different conductivity types in a first cell. The fifth and sixth transistors include multiple fifth active areas overlapping each other in the layout view. The second and third transistors are included in a second cell abutting the first cell in the second direction. The first gate stripe further crosses at least one in the fifth active areas.

Also disclosed is an integrated circuit that includes a first cell having a first cell height and including a first active area in a first layer and a second cell having a second cell height different from the first cell height. The second cell includes a first plurality of active areas in the first layer. The integrated circuit further includes a third cell having a third cell height greater than the first cell height and the second cell height. The third cell includes a second plurality of active areas in a second layer below the first layer. The first and second cells abut the third cell in a first direction, and the first and second cells abut each other in a second direction. The first active area and a first area in the second plurality of active areas align with each other along the first direction, and first and second areas in the first plurality of active areas align with second and third areas in the second plurality of active areas along the first direction. In some embodiments, the first cell height is smaller than the second cell height and the second cell height. In some embodiments, a number of the first plurality of active areas is smaller than a number of the second plurality of active areas. In some embodiments, the second cell further includes a third plurality of active areas in the second layer. The third plurality of active areas overlap the first plurality of active areas, and align with corresponding ones of the second plurality of active areas in a layout view. In some embodiments, the second cell further includes a non-doped region between the first and second areas in the first plurality of active areas, and a third area in the second plurality of active areas is disposed between the second and third areas in the second plurality of active areas. In some embodiments, the first active area align with a fourth area in the second plurality of active areas along the first direction. In some embodiments, the integrated circuit further includes multiple gate stripes that extend continuously in the second direction and shared by the first and second cells.

Also disclosed is a method that includes the operation below: forming a first plurality of active areas that extend in a first row, wherein one of the first plurality of active areas overlaps another one of the first plurality of active areas in a layout view; forming a second plurality of active areas that extend in a second row, wherein one of the second plurality of active areas overlaps another one of the second plurality of active areas in the layout view; forming a third plurality of active areas that extend in a third row between the first and second rows; and forming multiple gate structures extending to cross at least one of the first plurality of active areas, at least one of the second plurality of active areas, and at least one of the third plurality of active areas. In some embodiments, two overlapping active areas have different conductivity types. In some embodiments, the third plurality of active areas are shorter than the first plurality of active areas and the second plurality of active areas. In some embodiments, one of the third plurality of active areas overlaps another one of the third plurality of active areas in the layout view. In some embodiments, the method further includes forming a fourth plurality of active areas that extend in a fourth row adjacent to the second row, wherein one of the fourth plurality of active areas overlaps another one of the fourth plurality of active areas in the layout view. The third and fourth plurality of active areas are shorter than the first plurality of active areas and the second plurality of active areas.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An integrated circuit, comprising:
a first transistor of a first conductivity type comprising a first active area extending in a first direction;
a second transistor of the first conductivity type comprising at least two second active areas extending in the first direction and a first gate stripe crossing the at least two second active areas; and
a third transistor of a second conductivity type that is stacked on the second transistor and comprises at least two third active areas arranged above the at least two second active areas, wherein a top most boundary line of the first active area is aligned with a top most boundary line of one of the at least two third active areas in a layout view,
wherein the third transistor is separated from the first transistor and the second transistor along the first direction in the layout view.

2. The integrated circuit of claim 1, wherein the first conductivity type is N type, and the second conductivity type is P type.

3. The integrated circuit of claim 1, wherein the first transistor further comprises a fourth active area separate from the first active area in a second direction different from the first direction.

4. The integrated circuit of claim 3, wherein a cell height of a first cell including the first transistor is equal to a cell height of a second cell including the second and third transistors.

5. The integrated circuit of claim 3, wherein a bottom most boundary line of the fourth active area is aligned with a bottom most boundary line of one of the at least two third active areas in the layout view.

6. The integrated circuit of claim 1, wherein a cell height of a first cell including the first transistor is different from a cell height of a second cell including the second and third transistors.

7. The integrated circuit of claim 1, further comprising:
a fourth transistor of the second conductivity type that is stacked on the first transistor and comprises a fourth active area extending in the first direction and a second gate stripe extending in a second direction different from the first direction to pass across the fourth active area.

8. The integrated circuit of claim 7, further comprising:
fifth and sixth transistors of different conductivity types in a first cell, wherein the fifth and sixth transistors comprise a plurality of fifth active areas overlapping each other in the layout view,
wherein the second and third transistors are included in a second cell abutting the first cell in the second direction,
wherein the first gate stripe further crosses at least one in the plurality of fifth active areas.

9. An integrated circuit, comprising:
a first cell having a first cell height and comprising a first active area in a first layer;
a second cell having a second cell height different from the first cell height, wherein the second cell comprises a first plurality of active areas in the first layer; and
a third cell having a third cell height greater than the first cell height and the second cell height, wherein the third cell comprises a second plurality of active areas in a second layer below the first layer;
wherein the first and second cells abut the third cell in a first direction, and the first and second cells abut each other in a second direction,
wherein the first active area and a first area in the second plurality of active areas align with each other along the first direction, and
first and second areas in the first plurality of active areas align with second and third areas in the second plurality of active areas along the first direction.

10. The integrated circuit of claim 9, wherein the first cell height is smaller than the second cell height and the third cell height.

11. The integrated circuit of claim 9, wherein a number of the first plurality of active areas is smaller than a number of the second plurality of active areas.

12. The integrated circuit of claim 9, wherein the second cell further comprises:
a third plurality of active areas in the second layer, wherein the third plurality of active areas overlap the first plurality of active areas, and align with corresponding ones of the second plurality of active areas in a layout view.

13. The integrated circuit of claim 9, wherein the second cell further comprises a non-doped region between the first and second areas in the first plurality of active areas, and
a third area in the second plurality of active areas is disposed between the second and third areas in the second plurality of active areas.

14. The integrated circuit of claim 9, wherein the first active area aligns with a fourth area in the second plurality of active areas along the first direction.

15. The integrated circuit of claim 9, further comprising:
a plurality of gate stripes that extend continuously in the second direction and shared by the first and second cells.

16. A method, comprising:
forming a first plurality of active areas that extend in a first row, wherein one of the first plurality of active areas overlaps another one of the first plurality of active areas in a layout view;
forming a second plurality of active areas that extend in a second row, wherein one of the second plurality of active areas overlaps another one of the second plurality of active areas in the layout view;
forming a third plurality of active areas that extend in a third row between the first and second rows, wherein a length of one in the third plurality of active areas and a length of one in the second plurality of active areas are different from each other; and
forming a plurality of gate structures extending to cross at least one of the first plurality of active areas, at least one of the second plurality of active areas, and at least one of the third plurality of active areas.

17. The method of claim 16, wherein two overlapping active areas have different conductivity types.

18. The method of claim 16, wherein the third plurality of active areas are shorter than the first plurality of active areas and the second plurality of active areas.

19. The method of claim 16, wherein one of the third plurality of active areas overlaps another one of the third plurality of active areas in the layout view.

20. The method of claim 16, further comprising:
forming a fourth plurality of active areas that extend in a fourth row adjacent to the second row, wherein one of the fourth plurality of active areas overlaps another one of the fourth plurality of active areas in the layout view,
wherein the third and fourth plurality of active areas are shorter than the first plurality of active areas and the second plurality of active areas.

* * * * *